US011733279B2

(12) United States Patent
Fu et al.

(10) Patent No.: US 11,733,279 B2
(45) Date of Patent: Aug. 22, 2023

(54) CIRCUIT AND METHOD FOR DETECTING INSULATION RESISTANCE

(71) Applicant: Contemporary Amperex Technology Co., Limited, Ningde (CN)

(72) Inventors: Yanhui Fu, Ningde (CN); Le Chu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 106 days.

(21) Appl. No.: 17/566,715

(22) Filed: Dec. 31, 2021

(65) Prior Publication Data

US 2022/0120796 A1    Apr. 21, 2022

Related U.S. Application Data

(63) Continuation of application No. PCT/CN2021/096357, filed on May 27, 2021.

(30) Foreign Application Priority Data

Jul. 27, 2020 (CN) .......................... 202010730042.6

(51) Int. Cl.
*G01R 27/14* (2006.01)
(52) U.S. Cl.
CPC .................................. *G01R 27/14* (2013.01)
(58) Field of Classification Search
CPC ........ G01R 27/00; G01R 27/14; G01R 35/00; G01R 31/006; G01R 31/385;
(Continued)

(56) References Cited

U.S. PATENT DOCUMENTS 9,030,205 B2 * 5/2015 Kamata ................. B60L 3/0046
324/509
2016/0216220 A1  7/2016 Eyssler
(Continued)

FOREIGN PATENT DOCUMENTS

CN    202870174 U    4/2013
CN    103688183 A    3/2014
(Continued)

OTHER PUBLICATIONS

The International search report for PCT Application No. PCT/CN2021/096357, dated Aug. 25, 2021, 8 pages.
(Continued)

*Primary Examiner* — Son T Le
(74) *Attorney, Agent, or Firm* — East IP P.C.

(57) ABSTRACT

The present application discloses a circuit and a method for detecting insulation resistance. The circuit includes: a first voltage dividing module, a second voltage dividing module, a third voltage dividing module, a fourth voltage dividing module, a first switch module, a fifth voltage dividing module, a second switch module, a third switch module, and a detecting module, where the first voltage dividing module comprises a first voltage dividing unit and a second voltage dividing unit, and the third voltage dividing module comprises a third voltage dividing unit and a fourth voltage dividing unit. According to the embodiments of the present application, errors caused by fluctuations in the pull-up of the reference power supply can be avoided, and the accuracy of the circuit for detecting insulation resistance can be effectively improved.

9 Claims, 6 Drawing Sheets

(58) Field of Classification Search
CPC .... G01R 31/364; G01R 27/025; G01R 15/04; B60L 2240/547; B60L 3/00; B60L 3/0069; Y02T 10/70
See application file for complete search history.

(56) References Cited

U.S. PATENT DOCUMENTS

| | | | |
|---|---|---|---|
| 2019/0047436 A1* | 2/2019 | Song | G08B 21/18 |
| 2019/0064280 A1* | 2/2019 | Sun | G01R 31/14 |
| 2020/0217893 A1* | 7/2020 | Song | H01M 10/48 |
| 2022/0158314 A1* | 5/2022 | Krieg | H01M 50/569 |

FOREIGN PATENT DOCUMENTS

| | | | |
|---|---|---|---|
| CN | 108333548 A | | 7/2018 |
| CN | 208109933 U | | 11/2018 |
| CN | 109100618 A | | 12/2018 |
| CN | 109470923 A | | 3/2019 |
| CN | 110568372 A | | 12/2019 |
| CN | 210051820 U | | 2/2020 |
| CN | 210604926 U | | 5/2020 |
| CN | 210775656 U | | 6/2020 |
| CN | 113495202 A | * | 10/2021 |
| EP | 3361271 A1 | | 8/2018 |
| EP | 3489698 A1 | | 5/2019 |
| KR | 101622193 B1 | | 5/2016 |
| KR | 20160047633 A | | 5/2016 |

OTHER PUBLICATIONS

The First Office Action for Chinese Application No. 202010730042.6, dated Jun. 13, 2022, 18 pages.

The extended European search report for EP Application No. 21830375.8, dated Sep. 6, 2022, 9 pages.

* cited by examiner

CIRCUIT AND METHOD FOR DETECTING INSULATION RESISTANCE

CROSS-REFERENCE TO RELATED APPLICATIONS

This application is a continuation of International Application No. PCT/CN2021/096357, filed on May 27, 2021, which claims priority to Chinese Patent Application No. 202010730042.6, filed on Jul. 27, 2020, both of which are hereby incorporated by reference in their entireties.

TECHNICAL FIELD

This application relates to the field of new energy technologies, and in particular relates to a circuit and a method for detecting insulation resistance.

BACKGROUND

The replacement of fuel-fueled vehicles by electric vehicles has become a trend in the automotive industry. The mileage, service life, and safety of battery packs are particularly important for the use of electric vehicles. The power battery pack is one of the key components of electric vehicles, and the safety of its high-voltage power must be taken as the first consideration for the power battery system. Therefore, it is very important to test the insulation performance of electric vehicles.

At present, the insulation detecting circuit usually uses a method of pulling up a reference power to detect whether the insulation circuit is faulty. When the reference power fluctuates, the detection result from the insulation detection circuit will deviate greatly from the actual impedance of the insulation resistance, resulting in poor accuracy and reliability of the detection result from the circuit for detecting insulation resistance.

SUMMARY

The embodiments of the present application provide a circuit and a method for detecting insulation resistance, which can improve the accuracy of the circuit for detecting insulation resistance.

In a first aspect, a circuit for detecting insulation resistance is provided, including: a first voltage dividing module, a second voltage dividing module, a third voltage dividing module, a fourth voltage dividing module, a first switch module, a fifth voltage dividing module, a second switch module, a third switch module, and a detecting module, where the first voltage dividing module includes a first voltage dividing unit and a second voltage dividing unit, and the third voltage dividing module includes a third voltage dividing unit and a fourth voltage dividing unit;

where a first end of the first voltage dividing unit, a first end of the second voltage dividing module, and a first end of the fourth voltage dividing module are connected to a first end of a positive electrode equivalent insulation resistor, a second end of the second voltage dividing module and a second end of the first switch module are connected to a second end of the positive electrode equivalent insulation resistor through the third switch module, and a second end of the first voltage dividing unit is connected to a first end of the second voltage dividing unit, and a first end of the first switch module is connected to a second end of the fourth voltage dividing module;

a first end of the third voltage dividing unit and a first end of the second switch module are connected to a first end of a negative electrode equivalent insulation resistor through the third switch module, a second end of the second voltage dividing unit, a second end of the fourth voltage dividing unit, and a second end of the fifth voltage dividing module are connected to a second end of the negative electrode equivalent insulation resistor, and a second end of the third voltage dividing unit is connected to a first end of the fourth voltage dividing unit, and a second end of the second switch module is connected to a first end of the fifth voltage dividing module;

the detecting module is configured to acquire voltage signals at the first end of the second voltage dividing unit and the first end of the fourth voltage dividing unit when at least one of the first switch module and the second switch module is in an OFF state; determine, on the basis of the acquired voltage signals, that the first voltage dividing module, the second voltage dividing module, the third voltage dividing module, the first switch module, and the second switch module work normally; and calculate, on the basis of the acquired voltage signals, a resistance value of the positive electrode equivalent insulation resistor and a resistance value of the negative electrode equivalent insulation resistor.

In an embodiment, the circuit further includes: a sixth voltage dividing module, a fourth switch module, a seventh voltage dividing module, and a pull-up power supply;

the sixth voltage dividing module and the fourth switch module each are arranged between a second end of the third switch module and the second end of the positive electrode equivalent insulation resistor, a first end of the sixth voltage dividing module and a first end of the fourth switch module each are connected to the second end of the third switch module, a second end of the sixth voltage dividing module and a second end of the fourth switch module are each connected to the second end of the positive electrode equivalent insulation resistor;

the seventh voltage dividing module is arranged between the second end of the third switch module and the pull-up power supply, and the pull-up power supply is arranged at a second end of the seventh voltage dividing module;

the detecting module is specifically configured to:

determine, according to a preset circuit self-checking rule, that the first voltage dividing module, the second voltage dividing module, the third voltage dividing module, the first switch module, the second switch module, the third switch module, the sixth voltage dividing module, the fourth switch module, and the seventh voltage dividing module all work normally;

acquire a first voltage signal at the first end of the second voltage dividing unit and a second voltage signal at the first end of the fourth dividing unit when the third switch module and the fourth switch module are in an ON state;

acquire a third voltage signal at the first end of the second voltage dividing unit and a fourth voltage signal at the first end of the fourth voltage dividing unit when the first switch module, the third switch module, and the fourth switch module are in an ON state, or, acquire a fifth voltage signal at the first end of the second voltage dividing unit and a sixth voltage signal at the first end of the fourth voltage dividing unit when the second switch module, the third switch module, and the fourth switch module are all in an ON state; and calculate the resistance value of the positive electrode equivalent insulation resistor and the resistance value of the negative electrode equivalent insulation resistor on the basis of the first voltage signal, the second voltage signal, the third voltage signal, and the fourth voltage signal, or, calculate the resistance value of the positive electrode equivalent insulation resistor and the resistance value of the negative electrode equivalent insulation resistor on the basis of the first voltage signal, the second voltage signal, the fifth voltage signal, and the sixth voltage signal.

In a second aspect, a method for detecting insulation resistance is provided, where the method is applied to the circuit for detecting insulation resistance in the first aspect, and the method includes:

determining, according to a preset circuit self-checking rule, that the first voltage dividing module, the second voltage dividing module, the third voltage dividing module, the first switch module, and the second switch module all work normally;

acquiring, when the third switch module is in an ON state, a first voltage signal at the first end of the second voltage dividing unit and a second voltage signal at the first end of the fourth voltage dividing unit;

acquiring, when the first switch module or the second switch module is in an ON state and the third switch module is in an ON state, a first target voltage signal at the first end of the second voltage dividing unit and a second target voltage signal at the first end of the fourth voltage dividing unit;

calculating the resistance values of the positive electrode equivalent insulation resistor and the negative electrode equivalent insulation resistor, on the basis of the first target voltage signal, the second target voltage signal, a resistance value of the second voltage dividing module, a resistance value of the fourth voltage dividing module, a resistance value of the third voltage dividing unit, and a resistance value of the fourth voltage dividing unit.

In an embodiment, the determining, according to a preset circuit self-checking rule, that the first voltage dividing module, the second voltage dividing module, the third voltage dividing module, the first switch module, and the second switch module all work normally includes:

acquiring, when the first switch module, the second switch module, and the third switch module are all in an OFF state, a first self-checking voltage signal at the first end of the second voltage dividing unit and a second self-checking voltage signal at the first end of the fourth voltage dividing unit;

calculating a first voltage value across both ends of a battery module, on the basis of the first self-checking voltage signal, a resistance value of the first voltage dividing unit, and a resistance value of the second voltage dividing unit;

calculating a second voltage value across the both ends of the battery module, on the basis of the second self-checking voltage signal, the resistance value of the second voltage dividing module, the resistance value of the third voltage dividing unit, and the resistance value of the fourth voltage dividing unit;

determining, when a difference between the first voltage value and the second voltage value is less than or equal to a first preset threshold, that the first voltage dividing unit, the second voltage dividing unit, the second voltage dividing module, the third voltage dividing unit, and the fourth voltage dividing unit work normally;

acquiring a third self-checking voltage signal at the first end of the second voltage dividing unit, and a fourth self-checking voltage signal at the first end of the fourth voltage dividing unit, when the first switch module is in an ON state and the second switch module and the third switch module are both in an OFF state;

calculating a third voltage value across the both ends of the battery module, on the basis of the resistance value of the first voltage dividing unit, the resistance value of the second voltage dividing unit, and the third self-checking voltage signal;

calculating a fourth voltage value across the both ends of the battery module, on the basis of the resistance value of the second voltage dividing module, the resistance value of the third voltage dividing unit, the resistance value of the fourth voltage dividing unit, the resistance value of the fourth voltage dividing module, and the fourth self-checking voltage signal;

determining that the first switch module works normally, when a difference between the third voltage value and the fourth voltage value is less than or equal to a second preset threshold value;

acquiring a fifth self-checking voltage signal at the first end of the second voltage dividing unit and a sixth self-checking voltage signal at the first end of the fourth voltage dividing unit, when the second switch module is in an ON state and the first switch module and the third switch module are both in an OFF state;

calculating a fifth voltage value across the both ends of the battery module, on the basis of the resistance value of the first voltage dividing unit, the resistance value of the second voltage dividing unit, and the fifth self-checking voltage signal;

calculating a sixth voltage value across the both ends of the battery module, on the basis of the resistance value of the second voltage dividing module, the resistance value of the third voltage dividing unit, the resistance value of the fourth voltage dividing unit, the resistance value of the fifth voltage dividing module, and the sixth self-checking voltage signal;

determining that the second switch module works normally when a difference between the fifth voltage value and the sixth voltage value is less than or equal to the second preset threshold.

In an embodiment, the determining that the first switch module and the second switch module work normally specifically further includes:

acquiring, when the first switch module and the second switch module are both in an ON state and the third switch module is in an OFF state, a seventh self-checking voltage signal at the first end of the second voltage dividing unit and an eighth self-checking voltage signal at the first end of the fourth voltage dividing unit;

calculating a seventh voltage value across the both ends of the battery module, on the basis of the resistance value of the first voltage dividing unit, the resistance value of the second voltage dividing unit, and the seventh self-checking voltage signal;

calculating an eighth voltage value across the both ends of the battery module, on the basis of the resistance value of the third voltage dividing unit, the resistance value of the fourth voltage dividing unit, the resistance value of the second voltage dividing module, the resistance value of the fourth voltage dividing module, the resistance value of the fifth voltage dividing module, and the eighth self-checking voltage signal;

determining that the first switch module and the second switch module work normally when a difference between the seventh voltage value and the eighth voltage value is less than or equal to the second preset threshold value.

In an embodiment, when the first switch module and the second switch module are in an OFF state and the third switch module is in an ON state, the first voltage signal at the first end of the second voltage dividing unit, and the second voltage signal at the first end of the fourth voltage dividing unit, the method further includes:

acquiring, when the first switch module, the second switch module, the third switch module, and the fourth switch module are all in an OFF state, a ninth self-checking voltage at the first end of the sixth voltage dividing module and a first reference voltage of the pull-up power supply;

calculating a ninth voltage value at the first end of the sixth voltage dividing module, on the basis of the first reference voltage, a resistance value of the sixth voltage dividing module, and a resistance value of the seventh voltage dividing module;

determining that the sixth voltage dividing module and the seventh voltage dividing module work normally when a difference between the ninth self-checking voltage and the ninth voltage value is less than or equal to a third preset threshold.

In an embodiment, when the first switch module and the second switch module are in an OFF state and the third switch module is in an ON state, the first voltage signal at the first end of the second voltage dividing unit, and the second voltage signal at the first end of the fourth voltage dividing unit, the method further includes:

acquiring, when the third switch module is in an ON state, a tenth self-checking voltage signal at the first end of the sixth voltage dividing module and a second reference voltage of the pull-up power supply;

calculating a tenth voltage value, on the basis of the resistance value of the sixth voltage dividing module, the resistance value of the seventh voltage dividing module, and the second reference voltage;

acquiring, when the tenth self-checking voltage signal is not equal to the tenth voltage value, an eleventh self-checking voltage signal at the first end of the second voltage dividing unit and a twelfth self-checking voltage signal at the first end of the fourth voltage dividing unit;

calculating a voltage of a negative electrode of a first self-checking battery module relative to ground, on the basis of the resistance value of the third voltage dividing unit, the resistance value of the fourth voltage dividing unit, and the twelfth self-checking voltage signal;

calculating a voltage of a positive electrode of the first self-checking battery relative to ground, on the basis of the voltage of the negative electrode of the first self-checking battery relative to ground, the eleventh self-checking voltage signal, the resistance value of the first voltage dividing unit, and the resistance value of the second voltage dividing unit;

calculating a first parameter, on the basis of the voltage of the positive electrode of the first self-checking battery relative to ground, the second reference voltage, the tenth self-checking voltage signal, the resistance value of the second voltage dividing module, and the resistance value of the seventh voltage dividing module;

calculating a second parameter, on the basis of the resistance value of the third voltage dividing unit, the resistance value of the fourth voltage dividing unit, the resistance value of the sixth voltage dividing module, the voltage of the negative electrode of the first self-checking battery module relative to ground, and the tenth self-checking voltage signal;

determining that the third switch module works normally when the first parameter is equal to the second parameter.

In an embodiment, after the calculating a tenth voltage value, on the basis of the resistance value of the sixth voltage dividing module, the resistance value of the seventh voltage dividing module, and the second reference voltage, the method further includes:

controlling the first switch module to be in an ON state when the tenth self-checking voltage signal is equal to the tenth voltage value;

acquiring, when the first switch module and the third switch module are in an ON state, a thirteenth self-checking voltage signal at the first end of the second voltage dividing unit, a fourteenth self-checking voltage signal at the first end of the fourth voltage dividing unit, a fifteenth self-checking voltage signal at the first end of the sixth voltage dividing module, and a third reference voltage of the pull-up power supply;

calculating a voltage of a negative electrode of a second self-checking battery module relative to ground, on the basis of the fourteenth self-checking voltage signal, the resistance value of the third voltage dividing unit, and the resistance value of the fourth voltage dividing unit;

calculating a voltage of a positive electrode of the second self-checking battery module relative to ground, on the basis of the resistance value of the first voltage dividing unit, the resistance value of the second voltage dividing unit, the voltage of the negative electrode of the second self-checking battery module relative to ground, and the thirteenth self-checking voltage signal;

calculating a third parameter, on the basis of the resistance value of the second voltage dividing module, the resistance value of the fourth voltage dividing module, the resistance value of the seventh voltage dividing module, the voltage of the positive electrode of the second self-checking battery module relative to ground, the third reference voltage, and the fifteenth self-checking voltage signal;

calculating a fourth parameter, on the basis of the resistance value of the third voltage dividing unit, the resistance value of the fourth voltage dividing unit, the resistance value of the sixth voltage dividing module, the voltage of the negative electrode of the second self-checking battery module relative to ground, and the fifteenth self-checking voltage signal;

determining that the third switch module works normally when the third parameter is equal to the fourth parameter.

In an embodiment, the first target voltage signal includes a third voltage signal or a fifth voltage signal;

where the third voltage signal is a voltage signal acquired at the first end of the second voltage dividing unit when the first switch module and the third switch module are in an ON state;

the fifth voltage signal is a voltage signal acquired at the first end of the second voltage dividing unit when the second switch module and the third switch module are in an ON state;

the second target voltage signal includes a fourth voltage signal or a sixth voltage signal;

where the fourth voltage signal is a voltage signal acquired at the first end of the fourth voltage dividing unit when the first switch module and the third switch module are in an ON state;

the sixth voltage signal is a voltage signal acquired at the first end of the fourth voltage dividing unit when the second switch module and the third switch module are in an ON state.

In an embodiment, the calculating the resistance value of the positive electrode equivalent insulation resistor and the resistance value of the negative electrode equivalent insulation resistor, on the basis of the first target voltage signal, the second target voltage signal, a resistance value of the second voltage dividing module, a resistance value of the fourth voltage dividing module, a resistance value of the third voltage dividing unit, and a resistance value of the fourth voltage dividing unit specifically includes:

calculating a sum of the resistance value of the third voltage dividing unit and the resistance value of the fourth voltage dividing unit to obtain a first resistance value;

calculating a voltage of a negative electrode of a first battery module relative to ground, on the basis of the first resistance value, the resistance value of the fourth voltage dividing unit, and the second voltage signal;

calculating a voltage of a positive electrode of the first battery module relative to ground, on the basis of the resistance value of the first voltage dividing unit, the resistance value of the second voltage dividing unit, the first voltage signal, and the voltage of the negative electrode of the first battery module relative to ground;

determining a first relationship between the positive equivalent insulation resistor and the negative equivalent insulation resistor, on the basis of the voltage of the negative electrode of the first battery module relative to ground, the voltage of the positive electrode of the first battery module relative to ground, the resistance value of the second voltage dividing module, and the first resistance value;

obtaining, on the basis of the third voltage signal and the fourth voltage signal, a voltage of a negative electrode of a second battery module relative to ground and a voltage of a positive electrode of the second battery module relative to ground;

determining a second relationship between the positive electrode equivalent insulation resistor and the negative electrode equivalent insulation resistor, on the basis of the voltage of the negative electrode of the second battery module relative to ground, the voltage of the positive electrode of the second battery module relative to ground, a second resistance value, and the first resistance value, where the second resistance value is a parallel resistance value of the second voltage dividing module and the fourth voltage dividing module;

calculating, on the basis of the first relationship and the second relationship, the resistance value of the positive electrode equivalent insulation resistor and the resistance value of the negative electrode equivalent insulation resistor;

or, obtaining a voltage of a negative electrode of a third battery module relative to ground and a voltage of a positive electrode of the third battery module relative to ground on the basis of the fifth voltage signal and the sixth voltage signal;

determining a third relationship between the positive electrode equivalent insulation resistor and the negative electrode equivalent insulation resistor, on the basis of the voltage of the negative electrode of the third battery module relative to ground, the voltage of the positive electrode of the third battery module relative to ground, a third resistance value, and the resistance value of the second voltage dividing module, where the third resistance value is a parallel resistance value of the first resistance value and the fifth voltage dividing module;

calculating, on the basis of the first relationship and the third relationship, the resistance value of the positive electrode equivalent insulation resistor and the resistance value of the negative electrode equivalent insulation resistor.

According to the embodiments of the present application, the circuit for detecting insulation resistance uses the detecting module to collect voltage signals at different moments to calculate the resistance values of the equivalent insulation resistors. As such, the resistance values of the equivalent insulation resistors can be calculated without the reference power supply pull-up circuit. Therefore, the errors caused by the fluctuation due to the pull-up of the reference power supply can be avoided, thereby effectively improving the accuracy and reliability of the circuit for detecting insulation resistance. Moreover, according to the embodiments of the present application, self-diagnosis can be performed on the circuit for detecting insulation resistance to determine whether the components in the insulation detecting circuit work normally. As such, insulation resistance detection can be performed under the condition that the insulation detecting circuit works normally, which can further improve the accuracy and reliability of the circuit for detecting insulation resistance.

BRIEF DESCRIPTION OF THE DRAWINGS

The drawings necessary for explaining embodiments are described briefly below to illustrate the technical solutions of the embodiments of the present application more clearly, and other drawings can be obtained by those with ordinary skill in the art from those drawings without any creative work.

DETAILED DESCRIPTION

Features and exemplary embodiments of various aspects of the present application will be described in detail below. In order to make the objects, technical solutions and advantages of the present application clearer, the present application is further described in detail below with reference to the drawings and specific embodiments. It should be understood that, the specific embodiments described herein are only for illustration of the present application, and are not for limiting the present application. For those skilled in the art, the present application can be implemented without some of those specific details. The following description of the embodiments is only for providing a understanding of the present application by showing examples of the present application.

It is to be noted that relational terms such as first, second, and the like are used herein solely to distinguish one entity or operation from another entity or operation without necessarily requiring or implying any actual such relationship or order between such entities or operations. Moreover, the terms "include", "including", or any other variation thereof, are intended to cover a non-exclusive inclusion, such that a process, method, article or device that includes a series of elements does not include only those elements but may include other elements not explicitly listed or inherent to such process, method, article or device. An element preceded by "include . . . " does not, without more constraints, preclude the existence of additional identical elements in the process, method, article or device that includes the element. In this article, the symbol "&" means "and", for example, A&B means "A and B".

In order to solve the existing technical problems, the embodiments of the present application provide a circuit and a method for detecting insulation resistance. The circuit for detecting insulation resistance according to the embodiments of the present application is first described below.

Figure 1:
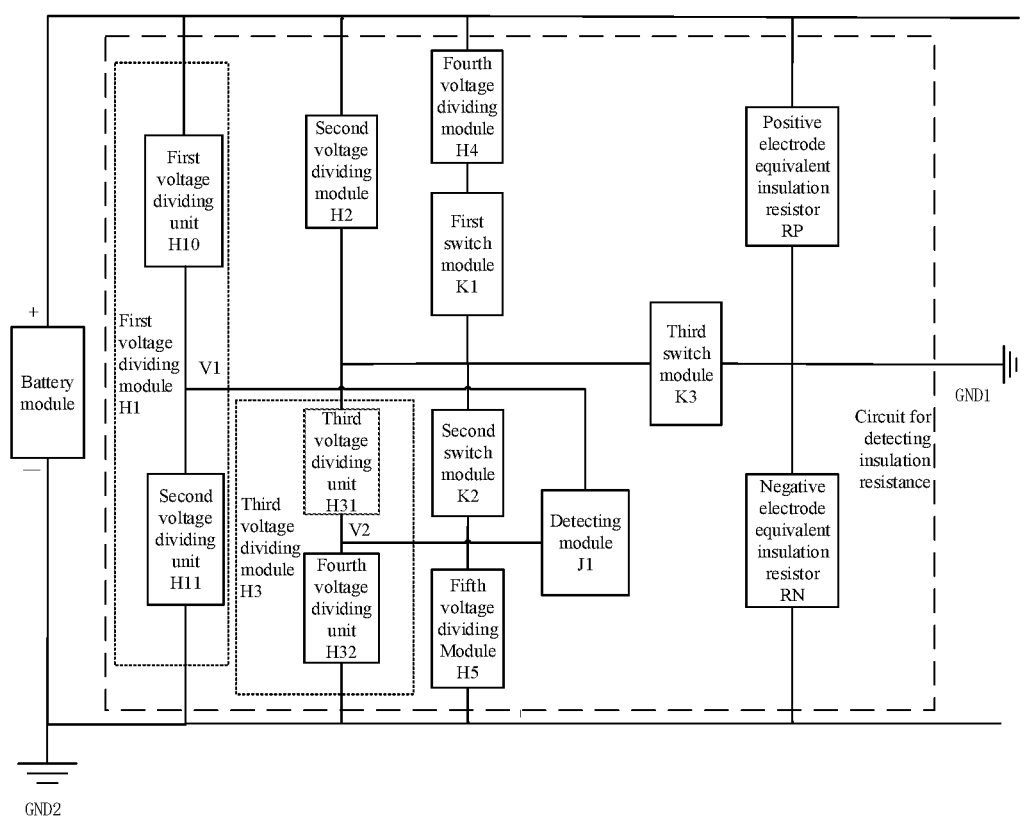
FIG. 1 is a schematic structural diagram of a circuit for detecting insulation resistance according to an embodiment of the present application.

FIG. 1 illustrates a schematic structural diagram of a circuit for detecting insulation resistance according to an embodiment of the present application. As shown in FIG. 1, the reference power pull-up circuit is omitted from the circuit for detecting insulation resistance. The circuit for detecting insulation resistance includes a first voltage dividing module H1, a second voltage dividing module H2, a third voltage dividing module H3, and a fourth voltage dividing module H4, a first switch module K1, a fifth voltage dividing module H5, a second switch module K2, a third switch module K3, and a detecting module J1. The first voltage dividing module H1 includes a first voltage dividing unit H10 and a second voltage dividing unit H11. The third voltage dividing module H3 includes a third voltage dividing unit H31 and a fourth voltage dividing unit H32.

A first end of the first voltage dividing unit H10, a first end of the second voltage dividing module H2, and a first end of the fourth voltage dividing module H4 are connected to a first end of a positive electrode equivalent insulation resistor RP. A second end of the second voltage dividing module H2 and a second end of the first switch module K1 are connected to a second end of the positive electrode equivalent insulation resistor RP through the third switch module K3. A second end of the first voltage dividing unit H10 is connected to a first end of the second voltage dividing unit H11, and a first end of the first switch module K1 is connected to a second end of the fourth voltage dividing module H4.

A first end of the third voltage dividing unit H31 and a first end of the second switch module K2 are connected to a first end of a negative electrode equivalent insulation resistor RN through the third switch module K3. A second end of the second voltage dividing unit H11, a second end of the fourth voltage dividing unit H32, and a second end of the fifth voltage dividing module H5 are connected to a second end of the negative electrode equivalent insulation resistor RN. A second end of the third voltage dividing unit H31 is connected to a first end of the fourth voltage dividing unit H32, and a second end of the second switch module K2 is connected to a first end of the fifth voltage dividing module K5. One of the first end and the second end of the positive electrode equivalent insulation resistor RP is connected to the positive electrode of the battery module. The other of the first end and the second end of the positive electrode equivalent insulation resistor RP is connected to a reference potential GND1. One of the first end and the second end of the negative electrode equivalent insulation resistor RN is connected to the negative electrode of the battery module. The other one of the first end and the second end of the negative equivalent insulation resistor RN is connected to the reference potential GND1.

The detecting module J1 may be configured to acquire voltage signals at the first end of the second voltage dividing unit H11 and the first end of the fourth voltage dividing unit H32 when at least one of the first switch module K1 and the second switch module K2 is in an OFF state; determine, on the basis of the acquired voltage signals, that the first voltage dividing module H1, the second voltage dividing module H2, the third voltage dividing module H3, the first switch module K1, and the second switch module K2 work normally; and calculate, on the basis of the acquired voltage signals, a resistance value of the positive electrode equivalent insulation resistor RP and a resistance value of the negative electrode equivalent insulation resistor RN.

The detection module J1 may include two analog-to-digital converters (Analog-to-digital converters, ADC) for collecting voltage signals at different moments, that is, collecting voltage signals when different switches are turned on.

Figure 2:
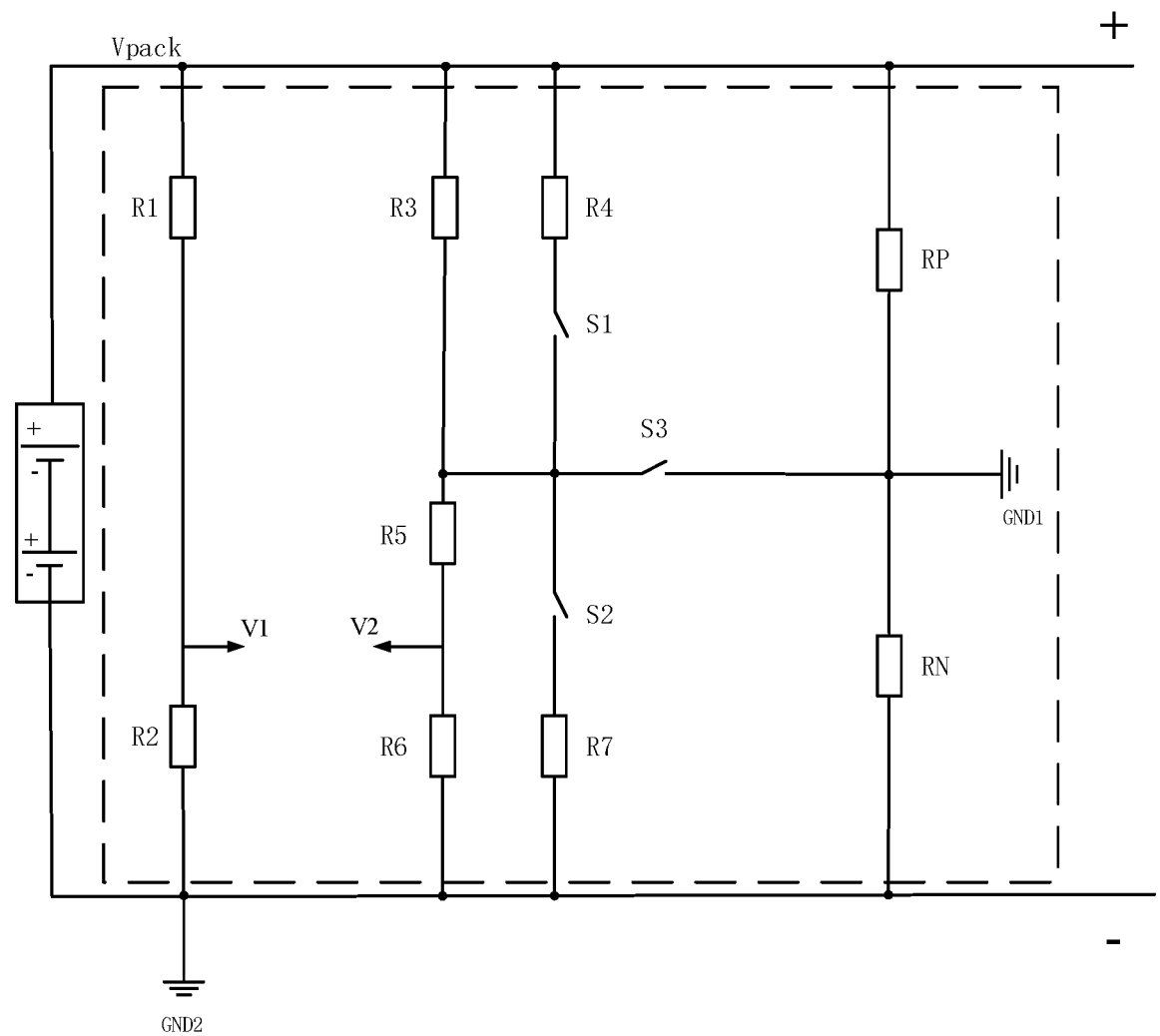
FIG. 2 is a schematic structural diagram of an insulation detecting circuit according to an embodiment of the present application.

FIG. 2 illustrates a schematic structural diagram of an insulation detecting circuit according to an embodiment of the present application. With reference to FIG. 2, in FIG. 2, a resistor R1 represents the first voltage dividing unit H10; a resistor R2 represents the second voltage dividing unit H11; a resistor R3 represents the second voltage dividing module H2; a resistor R5 represents the third voltage dividing unit H31; a resistor R6 represents the fourth voltage dividing unit H32; a resistor R4 represents the fourth voltage dividing module H4; a switch S1 represents the first switch module K1; a switch S2 represents the second switch module K2; a resistor R7 represents the fifth voltage dividing module H5; a switch S3 represents the third switch module K3; a resistor RP represents the positive electrode equivalent insulation resistor; a resistor RN represents the negative electrode equivalent insulation resistor; and GND1 represents the reference potential.

Specifically, the first end of R1, the first end of R3, and the first end of R4 are all connected to the first end of RP. The second end of R3 and the second end of S1 are both connected to the second end of RP through S3. The second end of R1 is connected to the first end of R2. The first end of S1 is connected to the second end of R4.

The first end of R5 and the first end of S2 are both connected to the first end of RN through S3. The second end of R2, the second end of R6 and the second end of R7 are all connected to the second end of RN. The second end of R5 is connected to the first end of R6. The second end of S2 is connected to the first end of R7.

One of the first end and the second end of the RP is connected to the positive electrode of the battery module, and the other of the first end and the second end of the RP is connected to GND1. One of the first end and the second end of RN is connected to the negative electrode of the battery module, and the other of the first end and the second end of RN is connected to GND1.

The detecting module J1 is configured to acquire the voltage signals at the first end of R2 and the first end of R6 when at least one of S1 and S2 is in an OFF state; determine that R1, R2, R3, R5, R6, S1, S2 all work normally on the basis of the acquired voltage signals; and calculate the resistance values of RP and RN on the basis of the acquired voltage signals. The specific process of this part will be described in detail in the method embodiments of the embodiments of the present application, and will not be detailed here.

In some embodiments, S3 is a switch with high insulation and withstand voltage capability to prevent S3 from breakdown due to high voltage. In this way, when S3 is turned off, it can be ensured that the line where S3 is located is normally turned off, thereby improving the insulation withstand voltage capability of the insulation detecting circuit, and it is not necessary to use switches with high insulation withstand voltage capability for both S1 and S2, which reduces the cost of the insulation detecting circuit.

According to the embodiments of the present application, the circuit for detecting insulation resistance uses the detecting module to collect voltage signals at different moments to calculate the resistance values of the equivalent insulation resistors. As such, the resistance values of the equivalent insulation resistors can be calculated without the reference power supply pull-up circuit. Therefore, the errors caused by the fluctuation due to the pull-up of the reference power supply can be avoided, thereby effectively improving the accuracy of the circuit for detecting insulation resistance. Moreover, according to the embodiments of the present application, self-diagnosis can be performed on the circuit for detecting insulation resistance to determine whether the components in the insulation detecting circuit work normally. As such, the insulation detecting circuit can be performed under the condition that the insulation detecting circuit works normally, which can further improve the accuracy and reliability of the circuit for detecting insulation resistance.

In some embodiments, based on the above circuit for detecting insulation resistance, the circuit for detecting insulation resistance may further include a sixth voltage dividing module, a fourth switch module, a seventh voltage dividing module, and a pull-up power supply.

The sixth voltage dividing module and the fourth switch module each are arranged between a second end of the third switch module and the second end of the positive electrode equivalent insulation resistor. A first end of the sixth voltage dividing module and a first end of the fourth switch module each are connected to the second end of the third switch module. A second end of the sixth voltage dividing module and a second end of the fourth switch module each are connected to the second end of the positive electrode equivalent insulation resistor.

The seventh voltage dividing module is arranged between the second end of the third switch module and the pull-up power supply. The pull-up power supply is arranged at a second end of the seventh voltage dividing module.

The detecting module is specifically configured to: determine, according to a preset circuit self-checking rule, that the first voltage dividing module, the second voltage dividing module, the third voltage dividing module, the first switch module, the second switch module, the third switch module, the sixth voltage dividing module, the fourth switch module, and the seventh voltage dividing module all work normally; acquire a first voltage signal V1 at the first end of the second voltage dividing unit and a second voltage signal V2 at the first end of the fourth dividing unit when the third switch module and the fourth switch module are in an ON state; acquire a third voltage signal V1' at the first end of the second voltage dividing unit and a fourth voltage signal V2' at the first end of the fourth voltage dividing unit when the first switch module, the third switch module, and the fourth switch module are in an ON state, or, acquire a fifth voltage signal V1" at the first end of the second voltage dividing unit and a sixth voltage signal V2" at the first end of the fourth voltage dividing unit when the second switch module, the third switch module, and the fourth switch module are all in an ON state; and calculate the resistance value of the positive electrode equivalent insulation resistor and the resistance value of the negative electrode equivalent insulation resistor on the basis of the first voltage signal V1, the second voltage signal V2, the third voltage signal V1', and the fourth voltage signal V2', or, calculate the resistance value of the positive electrode equivalent insulation resistor RP and the resistance value of the negative electrode equivalent insulation resistor RN on the basis of the first voltage signal V1, the second voltage signal V2, the fifth voltage signal V1", and the sixth voltage signal V2".

Figure 3:
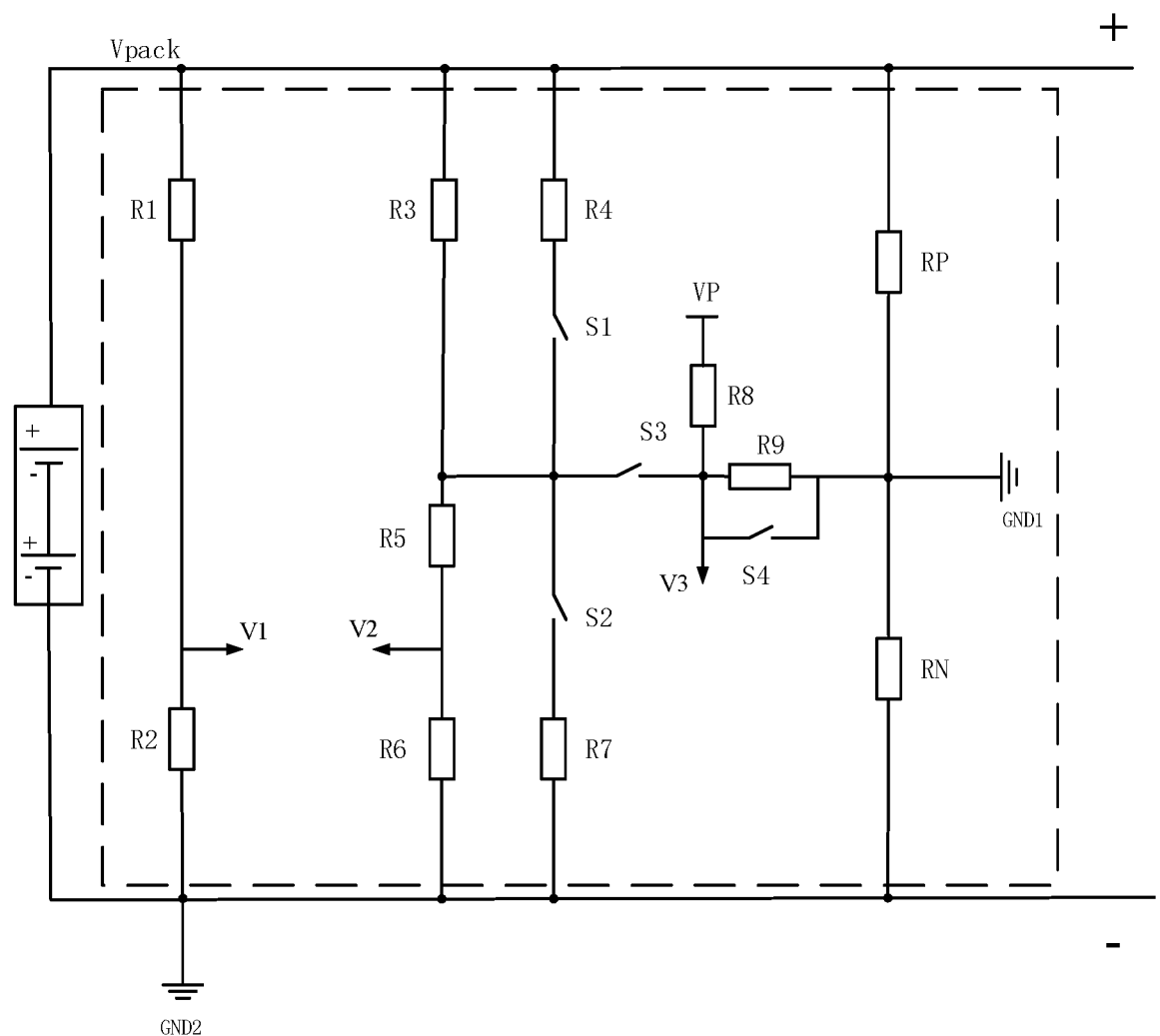
FIG. 3 is a schematic structural diagram of a circuit for detecting insulation resistance according to some embodiments of the present application.

Specifically, FIG. 3 illustrates a schematic structural diagram of according to some embodiments of the present application. Referring to FIG. 3, on the basis of the circuit for detecting insulation resistance as shown in FIG. 1 and FIG. 2, in FIG. 3, the resistance R9 represents the sixth voltage dividing module, R8 represents the seventh voltage dividing module, S4 represents the fourth switch module, and VP represents the pull-up power supply. Each switch in each circuit diagram is controlled by a controller, which is not shown in the drawings. The collection of the voltage signal at the first end of the second voltage dividing unit and the voltage signal at the first end of the fourth voltage dividing unit may be realized by a same detecting circuit. The detecting circuit may include two ADCs for collecting voltage signals at different moments, that is, collecting voltage signals when different switches are turned on.

R9 and S4 each are arranged between the second end of S3 and the second end of RP. The first ends of R9 and S4 each are connected to the second end of S3. The second ends of R9 and S4 each are connected to the second end of RP.

R8 is arranged between the second end of S3 and VP. VP is arranged at the second end of R8.

The detecting module may be specifically configured to determine that R1, R2, R3, R5, R6, S1, S2, S3, R8, S4, and R9 all work normally according to the preset circuit self-checking rule. The specific process of this part will be detailed in the method part of the embodiments of the present application, and will not be detailed here.

The detection module may be specifically configured to acquire V1 at the first end of R2 and V2 at the first end of R6 when S3 and S4 are turned on; and acquire V1' at the first end of R2 and V2' at the first end of R6 when S1, S3 and S4 are all turned on; or, when S2, S3 and S4 are turned on, acquire V1" at the first end of R2 and V2" at the first end of R6; and calculate the resistance values of RP and RN on the basis of V1, V2, V1' and V2'; or, calculate the resistance values of RP and RN on the basis of V1, V2, V1" and V2".

As such, by further providing the sixth voltage dividing module, the fourth switch module, and the seventh voltage dividing module, the self-diagnosing of the third switch module and the further provided sixth voltage dividing module, fourth switch module, and seventh voltage dividing module can be realized, the determination of whether the circuit for detecting insulation resistance works normally can be improved, and the insulation resistance detection is performed when the insulation detecting circuit works normally, which can further improve the accuracy and reliability of the circuit for detecting insulation resistance.

The above describes the circuit for detecting insulation resistance according to the embodiments of the present application. Based on the circuit for detecting insulation resistance, the application further provides a method for detecting insulation resistance, of which the details are described with reference to the following embodiments.

Figure 4:
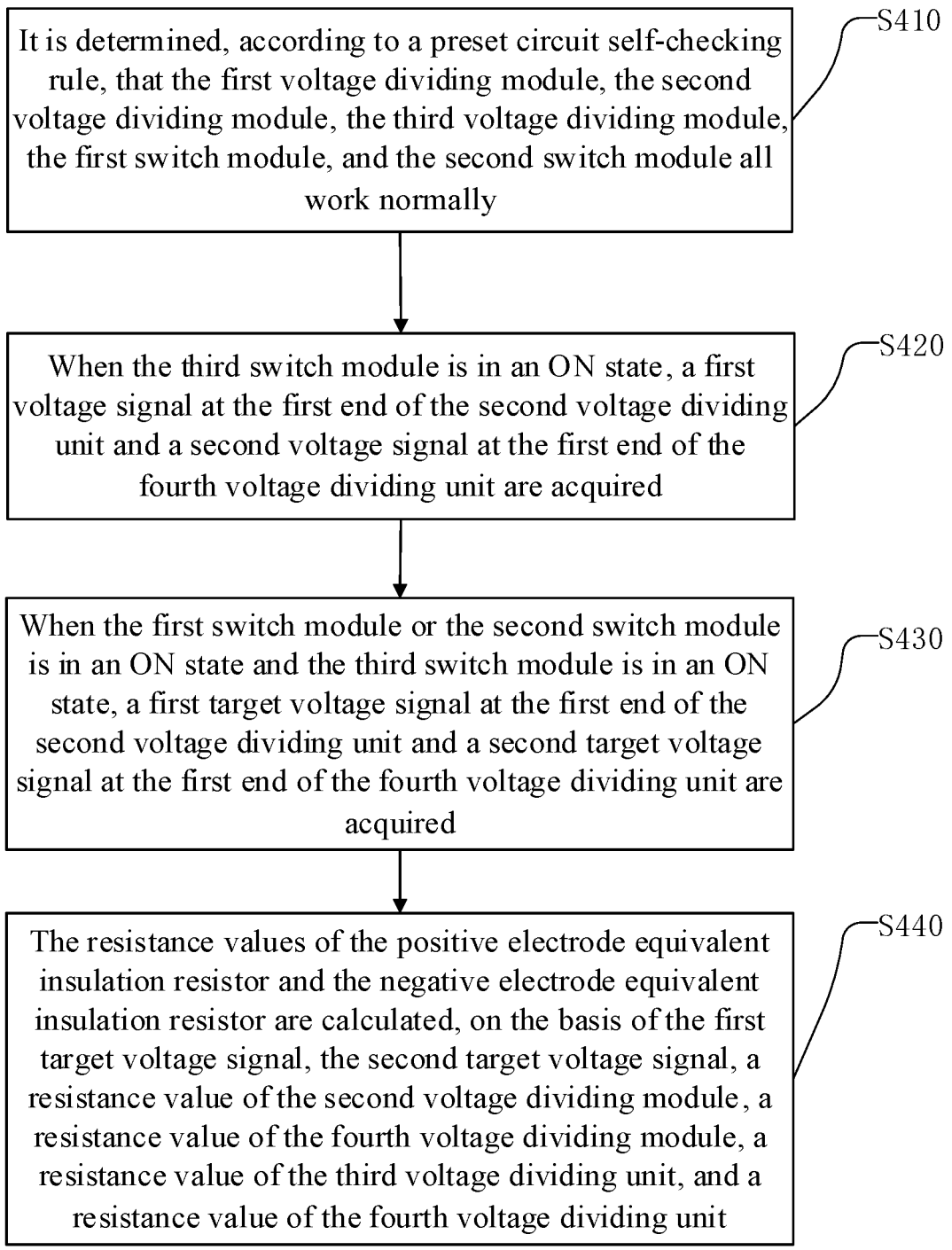
FIG. 4 is a schematic flowchart of a method for detecting insulation resistance according to some embodiments of the present application.

FIG. 4 illustrates a schematic flowchart of a method for detecting insulation resistance according to an embodiment of the present application. As shown in FIG. 4, the method may include S410-S440.

At S410, it is determined, according to a preset circuit self-checking rule, that the first voltage dividing module, the second voltage dividing module, the third voltage dividing module, the first switch module, and the second switch module all work normally.

Before the insulation resistance detection is performed based on the circuit for detecting insulation resistance, self-diagnosing may be performed on the circuit for detecting insulation resistance. Specifically, the self-diagnosing may be performed on the first voltage dividing module, the second voltage dividing module, the third voltage dividing module, the first switch module, the second switch module and other components in the circuit for detecting insulation resistance according to the preset circuit self-checking rule. That is, it is detected whether the components R1, R2, R3, R5, R6, S1, S2 and other components in the circuit for detecting insulation resistance in FIG. 2 work normally, and the insulation resistance detection is performed using the circuit for detecting insulation resistance when the above components all work normally.

At S420, when the third switch module is in an ON state, a first voltage signal at the first end of the second voltage dividing unit and a second voltage signal at the first end of the fourth voltage dividing unit are acquired.

When the insulation resistance detection is performed based on the circuit for detecting insulation resistance, the third switch module S3 may be closed to turn on S3 first. Then, the detecting module may acquire the first voltage signal V1 at the first end of the second voltage dividing unit R2 and the second voltage signal V2 at the first end of the fourth voltage dividing unit R6.

At S430, when the first switch module or the second switch module is in an ON state and the third switch module is in an ON state, a first target voltage signal at the first end of the second voltage dividing unit and a second target voltage signal at the first end of the fourth voltage dividing unit are acquired.

The first target voltage signal refers to the voltage signal acquired at the first end of the second voltage dividing unit when the first switch module or the second switch module is turned on and the third switch module is turned on. The second target voltage signal refers to the voltage signal acquired at the first end of the fourth voltage dividing unit when the first switch module or the second switch module is turned on and the third switching module is turned on.

Specifically, after V1 and V2 are acquired, the first switch module S1 or the second switch module S2 may be turned on after the third switch module S3 is turned on. Then, the first target voltage signal may be acquired at the first end of the second voltage dividing unit R2, and the second target voltage signal may be acquired at the first end of the fourth voltage dividing unit R6.

At S440, the resistance values of the positive electrode equivalent insulation resistor and the negative electrode equivalent insulation resistor are calculated, on the basis of the first target voltage signal, the second target voltage signal, a resistance value of the second voltage dividing module, a resistance value of the fourth voltage dividing module, a resistance value of the third voltage dividing unit, and a resistance value of the fourth voltage dividing unit.

After the first target voltage signal and the second target voltage signal are acquired, the resistance values of the positive electrode equivalent insulation resistor RP and the negative electrode equivalent insulation resistor RN may be calculated. Specifically, the resistance value of the second voltage dividing module R3, the resistance value of the fourth voltage dividing module R4, the resistance value of the third voltage dividing unit R5, and the resistance value of the fourth voltage dividing unit R6 may be determined, and then the resistance values of RP and RN may be calculated on the basis of the first target voltage signal, the second target voltage signal, the resistance value of R3, the resistance value of R4, the resistance values of R5 and R6. It can be understood that, after the resistance values of RP and RN are calculated, the minimum value of the resistance values of RP and RN may be used to determine whether the first insulation resistance value is normal. For example, whether the first insulation resistance value is normal may be determined according to the national standard. As such, it may be determined first that the first insulation resistance value is normal, then a precharge contactor, a main positive contactor or a main negative contactor may be turned on, the second insulation resistor outside the contactor may be detected, and relevant actions of the driver may be performed when it is determined that both the first insulation resistor and the second insulation resistor are in a safe state, so that the safety fault problem caused by turning on the contactor when the second insulation resistance is overly low is solved.

According to the embodiments of the present application, the circuit for detecting insulation resistance uses the detecting module to collect voltage signals at different moments and resistance values of the equivalent insulation resistors can be calculated, in which the reference power supply pull-up circuit is not necessary. Therefore, the errors caused by the fluctuation due to the pull-up of the reference power supply can be avoided, thereby effectively improving the accuracy and reliability of the circuit for detecting insulation resistance. Moreover, according to the embodiments of the present application, self-diagnosing can be performed on the circuit for detecting insulation resistance to determine whether the components in the insulation detecting circuit work normally. In this way, the insulation detecting circuit can be performed under the condition that the insulation detecting circuit works normally, which can further improve the accuracy and reliability of the circuit for detecting insulation resistance.

In some embodiments, the self-diagnosis processing of the first voltage dividing module, the second voltage dividing module, the third voltage dividing module, the first switch module, and the second switch module specifically includes: acquiring, when the first switch module, the second switch module, and the third switch module are all in an OFF state, a first self-checking voltage signal at the first end of the second voltage dividing unit and a second self-checking voltage signal at the first end of the fourth voltage dividing unit; calculating a first voltage value across both ends of a battery module, on the basis of the first self-checking voltage signal, a resistance value of the first voltage dividing unit, and a resistance value of the second voltage dividing unit; calculating a second voltage value across the both ends of the battery module, on the basis of the second self-checking voltage signal, and the resistance value of the second voltage dividing module, the resistance value of the third voltage dividing unit, and the resistance value of the fourth voltage dividing unit; determining, when a difference between the first voltage value and the second voltage value is less than or equal to a first preset threshold, that the first voltage dividing unit, the second voltage dividing unit, the second voltage dividing module, the third voltage dividing unit, and the fourth voltage dividing unit work normally; acquiring a third self-checking voltage signal at the first end of the second voltage dividing unit, and a fourth self-checking voltage signal at the first end of the fourth voltage dividing unit, when the first switch module is in an ON state and the second switch module and the third switch module are both in an OFF state; calculating a third voltage value across the both ends of the battery module, on the basis of the resistance value of the first voltage dividing unit, the resistance value of the second voltage dividing unit, and the third self-checking voltage signal; calculating a fourth voltage value across the both ends of the battery module, on the basis of the resistance value of the second voltage dividing module, the resistance value of the third voltage dividing unit, the resistance value of the fourth voltage dividing unit, the resistance value of the fourth voltage dividing module, and the fourth self-checking voltage signal; determining that the first switch module works normally, when a difference between the third voltage value and the fourth voltage value is less than or equal to a second preset threshold value; acquiring a fifth self-checking voltage signal at the first end of the second voltage dividing unit and a sixth self-checking voltage signal at the first end of the fourth voltage dividing unit, when the second switch module is in an ON state and the first switch module and the third switch module are both in an OFF state; calculating a fifth voltage value across the both ends of the battery module, on the basis of the resistance value of the first voltage dividing unit, the resistance value of the second voltage dividing unit, and the fifth self-checking voltage signal; calculating a sixth voltage value across the both ends of the battery module, on the basis of the resistance value of the second voltage dividing module, the resistance value of the third voltage dividing unit, the resistance value of the fourth voltage dividing unit, the resistance value of the fifth voltage dividing module, and the sixth self-checking voltage signal; determining that the second switch module works normally when a difference between the fifth voltage value and the sixth voltage value is less than or equal to the second preset threshold.

The first preset threshold refers to a value used in the determination of whether R1, R2, R3, R5, and R6 work normally, which may be set to 0 or other values based on the circuit error.

Specifically, with reference to FIG. 2, when the self-diagnosing of the first voltage dividing modules R1 and R2, the second voltage dividing module R3, and the third voltage dividing modules R5 and R6 is performed, first, the first self-checking voltage signal V11 at the first end of the second voltage dividing unit R2 and the second self-checking voltage signal V12 at the first end of the fourth voltage dividing unit R6 may be acquired when the first switch module S1, the second switch module S2 and the third switch module S3 are all in an OFF state. At this time, if R1, R2, R3, R5, and R6 work normally, the voltage value across the both ends of the battery module calculated on the basis of V11 should be the same as the voltage value across the both ends of the battery module calculated on the basis of V12. Therefore, the first voltage value $V_{O1}$ across the both ends of the battery module may be calculated on the basis of V11 and the resistance values of R1 and R2, and the specific calculation formula is shown as formula (1):

$$V_{O1} = \frac{V_{11} \cdot (R1 + R2)}{R2}. \tag{1}$$

The second voltage value $V_{O2}$ across the battery module may be calculated on the basis of V12 and the resistance values of R3, R5 and R6, and the specific calculation formula is shown as the following formula (2):

$$V_{O2} = \frac{V_{12} \cdot (R5 + R6 + R3)}{R6}. \tag{2}$$

Then, a difference between $V_{O1}$ and $V_{O2}$ may be calculated, it is determined whether the difference is less than or equal to the first preset threshold X1, for example, it is determined whether the inequality $V_{O2}-V_{O1} \geq X1$ is true. If the inequality $V_{O2}-V_{O1} \geq X$ is true, it can be determined that R1, R2, R3, R5, and R6 work normally.

When the self-diagnosing of the first switch module S1 is performed, S1 may be turned on and S2 and S3 may be kept in an OFF state, the third self-checking voltage signal V13 is acquired at the first end of R2, and the fourth self-checking voltage signal V14 is acquired at the first end of R6. At this time, both ends of R3 are connected in parallel with R4. In consideration of the influence of R3 being connected with R4 in parallel, if S1 works normally, the voltage value at the both ends of the battery module calculated on the basis of V14 should be equal to the voltage value at the both ends of the battery module calculated on the basis of V13. Therefore, the third voltage value $V_{O3}$ across the both ends of the battery module may be calculated on the basis of V13 and the resistance values of R1 and R2, and the specific calculation formula is shown as the following formula (3):

$$V_{O3} = \frac{V_{13} \cdot (R1 + R2)}{R2}. \tag{3}$$

The fourth voltage value $V_{O4}$ across the both ends of the battery module may be calculated on the basis of V14 and the resistance values of R3, R5, R6 and R4, and the specific calculation formula is shown as the following formula (4):

$$V_{O4} = \left(\frac{V_{14} \cdot (R5 + R6)}{R6}\right) \cdot \frac{(R5 + R6) + R3 // R4}{(R5 + R6)}. \tag{4}$$

Then, a difference between $V_{O3}$ and $V_{O4}$ may be calculated, and it is determined whether the difference is less than or equal to the second preset threshold X2, for example, it is determined whether the inequality $V_{O4}-V_{O3} \geq X2$ is true. If the inequality $V_{O4}-V_{O3} \geq X2$ is true, it can be determined that S1 works normally.

Similarly, when the self-diagnosing of the second switch module S2 is performed, S2 may be turned on and S1 and S3 may be kept in an OFF state, the fifth self-checking voltage signal V15 is acquired at the first end of R2, and the sixth self-checking voltage signal V16 is acquired at the first end of R6. Then, the fifth voltage value $V_{O5}$ across the both ends of the battery module may be calculated on the basis of V15 and the resistance values of R1 and R2, and the specific calculation formula is shown as the following formula (5):

$$V_{O5} = \frac{V_{15} \cdot (R1 + R2)}{R2}. \tag{5}$$

The sixth voltage value $V_{16}$ across the both ends of the battery module may be calculated on the basis of the resistance values of R3, R5, R6 and R7, and the specific calculation formula is shown as the following formula (6):

$$V_{O6} = \left(\frac{V_{16} \cdot (R5 + R6)}{R6}\right) \cdot \frac{(R5 + R6) // R7 + R3}{(R5 + R6) // R7}. \tag{6}$$

Then, a difference between $V_{O6}$ and $V_{O5}$ may be calculated, and it is determined whether the difference is less than or equal to the second preset threshold X2, for example, it is determined whether the inequality $V_{O6}-V_{O5} \geq X2$ is true. If the inequality $V_{O6}-V_{O5} \geq X2$ is true, it can be determined that S2 works normally.

As such, the voltage values across the both ends of the battery module are calculated on the basis of the voltage signals acquired at the first end of the second voltage dividing unit and the first end of the fourth voltage dividing unit in different manners, and it is determined that the components of the circuit for detecting insulation resistance work normally when the difference between the two calculated voltage values across the both ends of the battery module in each manner is less than the preset threshold, which can further improve the accuracy of the self diagnosing result of the circuit for detecting insulation resistance, and therefore the accuracy of the circuit for detecting insulation resistance can be improved.

In some embodiments, the self-diagnosing of the first switch module S1 and the second switch module S2 may be performed at the same time, and the corresponding processing may be as follows: acquiring, when the first switch module and the second switch module are both in an ON state and the third switch module is in an OFF state, a seventh self-checking voltage signal at the first end of the second voltage dividing unit and an eighth self-checking voltage signal at the first end of the fourth voltage dividing unit; calculating a seventh voltage value across the both ends of the battery module, on the basis of the resistance value of the first voltage dividing unit, the resistance value of the second voltage dividing unit, and the seventh self-checking voltage signal; calculating an eighth voltage value across the both ends of the battery module, on the basis of the resistance value of the third voltage dividing unit, the resistance value of the fourth voltage dividing unit, the resistance value of the second voltage dividing module, the resistance value of the fourth voltage dividing module, the resistance value of the fifth voltage dividing module, and the eighth self-checking voltage signal; determining that the first switch module and the second switch module work normally when a difference between the seventh voltage value and the eighth voltage value is less than or equal to the second preset threshold value.

Specifically, when the self-diagnosing of S1 and S2 is performed at the same time, S1 and S2 may be turned on and S3 may be kept in an OFF state, the seventh self-checking voltage signal $V_{17}$ at the first end of R2 and the eighth self-checking voltage signal $V_{18}$ at the first end of R6 may be acquired. Then, the seventh voltage value $V_{O7}$ across the battery module may be calculated on the basis of $V_{17}$ and the resistance values of R1 and R2, and the specific calculation formula is shown as the following formula (7):

$$V_{O7} = \frac{V_{17} \cdot (R1+R2)}{R2}. \quad (7)$$

The sixth voltage value $V_{O8}$ across the battery module may be calculated on the basis of $V_{18}$ and the resistance values of R3, R4, R5, R6 and R7, and the specific calculation formula is shown as the following formula (8):

$$V_{O8} = \left(\frac{V_{18} \cdot (R5+R6)}{R6}\right) \cdot \frac{(R5+R6) // R7 + R3 // R4}{(R5+R6) // R7}. \quad (8)$$

Then, a difference between $V_{O8}$ and $V_{O7}$ may be calculated, it is determined whether the difference is less than or equal to the second preset threshold X2, for example, it is determined whether the inequality $V_{O8}-V_{O7} \geq X2$ is true. If the inequality $V_{O8}-V_{O7} \geq X2$ is true, it can be determined that S1 and S2 work normally. In this way, S1 and S2 are detected at the same time, which can improve the self-diagnosing efficiency of the circuit for detecting insulation resistance to a certain extent.

In some embodiments, self-diagnosing of the sixth voltage dividing module and the seventh voltage dividing module may be performed to determine that the sixth voltage dividing module and the seventh voltage dividing module work normally. The corresponding specific processing may be as follows: acquiring, when the first switch module, the second switch module, the third switch module, and the fourth switch module are all in an OFF state, a ninth self-checking voltage at the first end of the sixth voltage dividing module and a first reference voltage of the pull-up power supply; calculating a ninth voltage value at the first end of the sixth voltage dividing module, on the basis of the first reference voltage, a resistance value of the sixth voltage dividing module, and a resistance value of the seventh voltage dividing module; determining that the sixth voltage dividing module and the seventh voltage dividing module work normally when a difference between the ninth self-checking voltage and the ninth voltage value is less than or equal to a third preset threshold.

Specifically, when the self-diagnosing of the sixth voltage dividing module R9 and the seventh voltage dividing module R8 is performed, S1, S2, S3, and S4 may be turned off, and the ninth self-checking voltage V19 at the first end of R9 and the first reference voltage VP1 of the pull-up power supply VP are acquired. Then, the ninth voltage value $V_{O9}$ at the first end of R9, that is, the divided voltage value of R9, may be calculated on the basis of VP1 and the resistance values of R9 and R8. After $V_{O9}$ is calculated, a difference between V19 and $V_{O9}$ is calculated, and it is determined whether the difference is less than or equal to the third preset threshold X3, that is, it may be determined whether the inequality $V_{O9} \leq X3$ is true. If $V_{O9}-V_{19} \leq X3$ is true, it may be determined that the sixth voltage dividing module R9 and the seventh voltage dividing module R8 work normally. X3 may be set to 0, or it may be set based on the circuit error. As such, the self-diagnosing of the sixth voltage dividing module R9 and the seventh voltage dividing module R8 is performed. When R9 and R8 work normally, the self-diagnosing of other components may be performed in combination with R9 and R8, which can improve the accuracy of the diagnosis result, and therefore the accuracy and reliability of the circuit for detecting insulation resistance can be further improved.

It can be understood that, in some embodiments, in order to further improve the accuracy of the circuit for detecting insulation resistance, self-diagnosing of the fourth switch module S4 may be performed to determine that S4 works normally. Specifically, S1, S2, S3, and S4 may all be kept in an OFF state, and then S4 may be turned on to acquire the voltage signal V3 at the first end of the sixth voltage dividing module. At this time, R8 is short-circuited, and if V3 is equal to 0, it can be determined that S4 works normally.

In some embodiments, self-diagnosing of the third switch module S3 may be performed to determine that S3 works normally, and the corresponding specific processing may be as follows: acquiring, when the third switch module is in an ON state, a tenth self-checking voltage signal at the first end of the sixth voltage dividing module and a second reference voltage of the pull-up power supply; calculating a tenth voltage value, on the basis of the resistance value of the sixth voltage dividing module, the resistance value of the seventh voltage dividing module, and the second reference voltage; acquiring, when the tenth self-checking voltage signal is not equal to the tenth voltage value, an eleventh self-checking voltage signal at the first end of the second voltage dividing unit and a twelfth self-checking voltage signal at the first end of the fourth voltage dividing unit; calculating a voltage of a negative electrode of a first self-checking battery module relative to ground, on the basis of the resistance value of the third voltage dividing unit, the resistance value of the fourth voltage dividing unit, and the twelfth self-checking voltage signal; calculating a voltage of a positive electrode of the first self-checking battery relative to ground, on the basis of the voltage of the negative electrode of the first self-checking battery relative to ground, the eleventh self-checking voltage signal, the resistance value of the first voltage dividing unit, and the resistance value of the second voltage dividing unit; calculating a first parameter, on the basis of the voltage of the positive electrode of the first self-checking battery relative to ground, the second reference voltage, the tenth self-checking voltage signal, the resistance value of the second voltage dividing module, and the resistance value of the seventh voltage dividing module; calculating a second parameter, on the basis of the resistance value of the third voltage dividing unit, the resistance value of the fourth voltage dividing unit, the resistance value of the sixth voltage dividing module, the voltage of the negative electrode of the first self-checking battery module relative to ground, and the tenth self-checking voltage signal; determining that the third switch module works normally when the first parameter is equal to the second parameter.

Specifically, S3 can be turned on, and the tenth self-checking voltage signal V110 at the first end of R9 and the second reference voltage VP2 of the pull-up power supply VP may be acquired. Then, the tenth voltage value VO10 may be calculated on the basis of VP2 and the resistance values of R8 and R9, and the specific calculation formula may be as follows:

$$V_{O10} = \frac{VP_2 \cdot (R9)}{R8 + R9}. \quad (9)$$

Then, it can be determined whether V110 is equal to VO10. If V110 is equal to VO10, the eleventh self-checking voltage signal V111 at the first end of R2 and the twelfth self-checking voltage signal V112 at the first end of R6 are acquired. Then the voltage VNEG1 of the negative electrode of the first self-checking battery module relative to ground is calculated on the basis of V112 and the resistance values of R5 and R6, and the specific calculation formula may be as follows:

$$VNEG1 = \frac{V_{112} \cdot (R5 + R6)}{R6}. \quad (10)$$

After VNEG1 is calculated, the voltage VPOS1 of the positive electrode of the first self-checking battery module relative to ground may be calculated on the basis of VNEG1, V111 and the resistance values of R1 and R2, and the specific calculation formula may be as follows:

$$VPOS1 = \frac{V_{111} \cdot (R1 + R2)}{R2} - VNEG1. \quad (11)$$

Then, the first parameter A1 may be calculated on the basis of VPOS1, VP2, V110 and the resistance value of R3 and the resistance value of R8. and the specific calculation formula may be as follows:

$$A1 = \frac{VPOS1}{R3} + \frac{VP_2 - V_{110}}{R8}. \quad (12)$$

The second parameter A2 may be calculated on the basis of VNEG1, V110 and the resistance values of R5, R6 and R9, and the specific calculation formula may be as follows:

$$A2 = \frac{VNEG1}{R5 + R6} + \frac{V_{110}}{R9}. \quad (13)$$

Then, A1 may be compared with A2 to determine whether A1 is equal to A2. If A1 is equal to A2, it can be determined that the third switch module works normally. As such, the self-diagnosing of S3 is performed and it is determined that S3 works normally, which can further improve the accuracy of the self-diagnosing result of other components in combination with S3, thereby further improving the accuracy and reliability of the circuit for detecting insulation resistance.

In some embodiments, when V110 is equal to VO10, that S3 works normally may be determined by the following method: controlling the first switch module to be in an ON state when the tenth self-checking voltage signal is equal to the tenth voltage value; acquiring, when the first switch module and the third switch module are in an ON state, a thirteenth self-checking voltage signal at the first end of the second voltage dividing unit, a fourteenth self-checking voltage signal at the first end of the fourth voltage dividing unit, a fifteenth self-checking voltage signal at the first end of the sixth voltage dividing module, and a third reference voltage of the pull-up power supply; calculating a voltage of a negative electrode of a second self-checking battery module relative to ground, on the basis of the fourteenth self-checking voltage signal, the resistance value of the third voltage dividing unit, and the resistance value of the fourth voltage dividing unit; calculating a voltage of a positive electrode of the second self-checking battery module relative to ground, on the basis of the resistance value of the first voltage dividing unit, the resistance value of the second voltage dividing unit, the voltage of the negative electrode of the second self-checking battery module relative to ground, and the thirteenth self-checking voltage signal; calculating a third parameter, on the basis of the resistance value of the second voltage dividing module, the resistance value of the fourth voltage dividing module, the resistance value of the seventh voltage dividing module, the voltage of the positive electrode of the second self-checking battery module relative to ground, the third reference voltage, and the fifteenth self-checking voltage signal; calculating a fourth parameter, on the basis of the resistance value of the third voltage dividing unit, the resistance value of the fourth voltage dividing unit, the resistance value of the sixth voltage dividing module, the voltage of the negative elec- trode of the second self-checking battery module relative to ground, and the fifteenth self-checking voltage signal; determining that the third switch module works normally when the third parameter is equal to the fourth parameter.

Specifically, when V110 is equal to VO10, S1 may be controlled to be turned on. When S1 and S3 are both turned on, the thirteenth self-checking voltage signal V113 at the first end of R2, the fourteenth self-checking voltage signal V114 at the first end of R6, the fifteenth self-checking voltage signal V115 at the first end of R9, and the third reference voltage VP3 of the pull-up power supply VP may be acquired. Then, the voltage VNEG2 of the negative electrode of the second self-checking battery module relative to ground may be calculated on the basis of V114 and the resistance values of R5 and R6, and the specific calculation formula may be as follows:

$$VNEG2 = \frac{V_{114} \cdot (R5 + R6)}{R6}. \qquad (14)$$

After VNEG2 is calculated, the voltage VPOS2 of the positive electrode of the second self-checking battery module relative to ground may be calculated on the basis of VNEG2, V113 and the resistance values of R1 and R2, and the specific calculation formula may be as follows:

$$VPOS2 = \frac{V_{113} \cdot (R1 + R2)}{R2} - VNEG2. \qquad (15)$$

Then, the third parameter A3 may be calculated on the basis of VPOS2, VP3, V115 and the resistance value of R3, R4 and R8, and the specific calculation formula may be as follows:

$$A3 = \frac{VPOS2}{R3 // R4} + \frac{VP_3 - V_{115}}{R8}. \qquad (16)$$

The fourth parameter A4 may be calculated on the basis of VNEG2, $V_{115}$ and the resistance values of R5, R6 and R9, and the specific calculation formula may be as follows:

$$A4 = \frac{VNEG2}{R5 + R6} + \frac{V_{115}}{R9}. \qquad (17)$$

Then, A3 is compared with A4 to determine whether A3 is equal to A4. If A3 is equal to A4, it can be determined that the third switch module works normally. It can be understood that, different combinations of S1, S2, and S3 may be used to implement the self-diagnosing of S3, and the implementation principle is similar, which will not be repeated here. As such, the self-diagnosing of S3 may be performed in different manners to determine that S3 works normally.

In some embodiments, the first target voltage signal may include a third voltage signal or a fifth voltage signal.

The third voltage signal is a voltage signal acquired at the first end of the second voltage dividing unit R2 when the first switch module S1 and the third switch module S3 are in an ON state.

The fifth voltage signal is a voltage signal acquired at the first end of the second voltage dividing unit R2 when the second switch module S2 and the third switch module S3 are in an ON state.

The second target voltage signal may include a fourth voltage signal or a sixth voltage signal.

The fourth voltage signal is a voltage signal acquired at the first end of the fourth voltage dividing unit R4 when the first switch module S1 and the third switch module S3 are in an ON state.

The sixth voltage signal is a voltage signal acquired at the first end of the fourth voltage dividing unit R4 when the second switch module S2 and the third switch module S3 are in an ON state.

In some embodiments, the calculating the resistance value of the positive electrode equivalent insulation resistor and the resistance value of the negative electrode equivalent insulation resistor, on the basis of the first target voltage signal, the second target voltage signal, a resistance value of the second voltage dividing module, a resistance value of the fourth voltage dividing module, a resistance value of the third voltage dividing unit, and a resistance value of the fourth voltage dividing unit may specifically include the following processing steps:

calculating a sum of the resistance value of the third voltage dividing unit and the resistance value of the fourth voltage dividing unit to obtain a first resistance value;

calculating a voltage of a negative electrode of a first battery module relative to ground, on the basis of the first resistance value, the resistance value of the fourth voltage dividing unit, and the second voltage signal;

calculating a voltage of a positive electrode of the first battery module relative to ground, on the basis of the resistance value of the first voltage dividing unit, the resistance value of the second voltage dividing unit, the first voltage signal, and the voltage of the negative electrode of the first battery module relative to ground;

determining a first relationship between the positive equivalent insulation resistor and the negative equivalent insulation resistor, on the basis of the voltage of the negative electrode of the first battery module relative to ground, the voltage of the positive electrode of the first battery module relative to ground, the resistance value of the second voltage dividing module, and the first resistance value;

obtaining, on the basis of the third voltage dividing signal and the fourth voltage dividing signal, a voltage of a negative electrode of a second battery module relative to ground and a voltage of a positive electrode of the second battery module relative to ground;

determining a second relationship between the positive electrode equivalent insulation resistor and the negative electrode equivalent insulation resistor, on the basis of the voltage of the negative electrode of the second battery module relative to ground, the voltage of the positive electrode of the second battery module relative to ground, a second resistance value, and the first resistance value; and calculating, on the basis of the first relationship and the second relationship, the resistance value of the positive electrode equivalent insulation resistor and the resistance value of the negative electrode equivalent insulation resistor;

or, obtaining a voltage of a negative electrode of a third battery module relative to ground and a voltage of a positive electrode of the third battery module relative to ground on the basis of the fifth voltage dividing signal and the sixth voltage dividing signal;

determining a third relationship between the positive electrode equivalent insulation resistor and the negative electrode equivalent insulation resistor, on the basis of the voltage of the negative electrode of the third battery module relative to ground, the voltage of the positive electrode of the third battery module relative to ground, a third resistance value, and the resistance value of the second voltage dividing module; and calculating, on the basis of the first relationship and the third relationship, the resistance value of the positive electrode equivalent insulation resistor and the resistance value of the negative electrode equivalent insulation resistor.

The second resistance value is a parallel resistance value of the second voltage dividing module and the fourth voltage dividing module.

The third resistance value is a parallel resistance value of the first resistance value and the fifth voltage dividing module.

Specifically, when the first target voltage signal is the third voltage signal V1' and the second target voltage signal is the fourth voltage signal V2', the resistance values of the positive electrode equivalent insulation resistor RP and the negative electrode equivalent insulation resistance RN may be calculated by the following processing steps.

First, the sum of the resistance values of the third voltage dividing unit R5 and the fourth voltage dividing unit R6 may be calculated to obtain the first resistance value, that is, R5+R6. The voltage VNEG1 of the negative electrode of the first battery module relative to the ground may be calculated according to formula (11) on the basis of the first resistance value R5+R6, the resistance value of the fourth voltage dividing unit R6, and the second voltage signal V2. After VNEG1 is calculated, the voltage VPOS1 of the positive electrode of the first battery module relative to ground may be calculated according to formula (12) on the basis of the resistance values of the first voltage dividing unit R1 and the second voltage dividing unit R2, the first voltage signal V1 and the voltage VNEG1 of the negative electrode of the first battery module relative to ground. Then, the first relationship between the positive electrode equivalent insulation resistor RP and the negative electrode equivalent insulation resistor RN may be calculated on the basis of the resistance values of VNEG1, VPOS1, R3 and R5+R6, and the first relationship may be as follows:

$$\frac{VPOS}{Rp // R3} = \frac{VNEG}{Rn // (R5 + R6)}. \tag{18}$$

Similarly, the voltage VNEG2 of the negative electrode of the second battery module and the voltage VPOS2 of the positive electrode of the second battery module may be calculated on the basis of the third voltage signal V1' and the fourth voltage signal V2'. Then the parallel resistance value R3//R4 of the second voltage dividing module R3 and the fourth voltage dividing module R4 is calculated. Then, the second relationship between RP and RN is calculated on the basis of VNEG2, VPOS2 and R3//R4, and the second relationship may be as follows:

$$\frac{VPOS2}{Rp // (R3 // R4)} = \frac{VNEG2}{Rn // (R5 + R6)}. \tag{19}$$

The resistance values of RP and RN are calculated according to the first relationship and the second relationship.

Alternatively, the voltage VNEG3 of the negative electrode of the third battery module relative to ground and the voltage VPOS3 of the positive electrode of the third battery module relative to ground may be calculated on the basis of the fifth voltage signal V1" and the sixth voltage signal V2". The parallel third resistance value (R5+R6)//R7 of the first resistance value R5+R6 and the fifth voltage dividing module R7 is calculated. The third relationship between RP and RN is calculated on the basis of VNEG3, VPOS3, (R5+R6)//R7, and R3, and the third relationship may be as follows:

$$\frac{VPOS3}{Rp // R3} = \frac{VNEG3}{Rn // (R5 + R6) // R7}. \tag{20}$$

The resistance values of RP and RN are calculated according to the first relationship and the third relationship.

Figure 5:
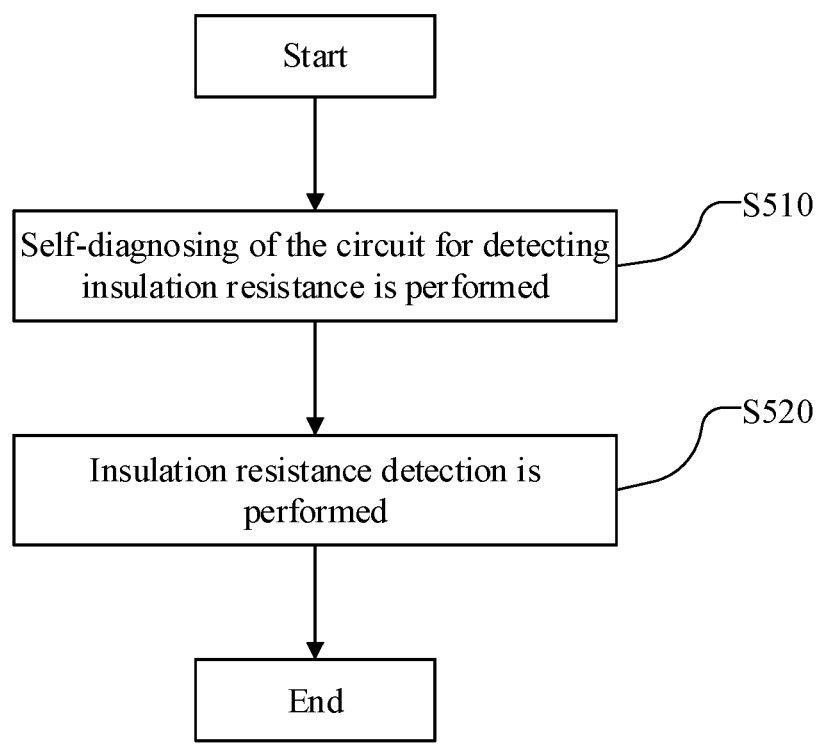
FIG. 5 is a schematic flowchart of a method for detecting insulation resistance according to some embodiments of the present application.

FIG. 5 illustrates a schematic flowchart of a complete method for detecting insulation resistance according to an embodiment of the present application. As shown in FIG. 5, the method may include the following steps.

At S510, self-diagnosing of the circuit for detecting insulation resistance is performed. That is, the processing of S410 described above is performed.

Figure 6:
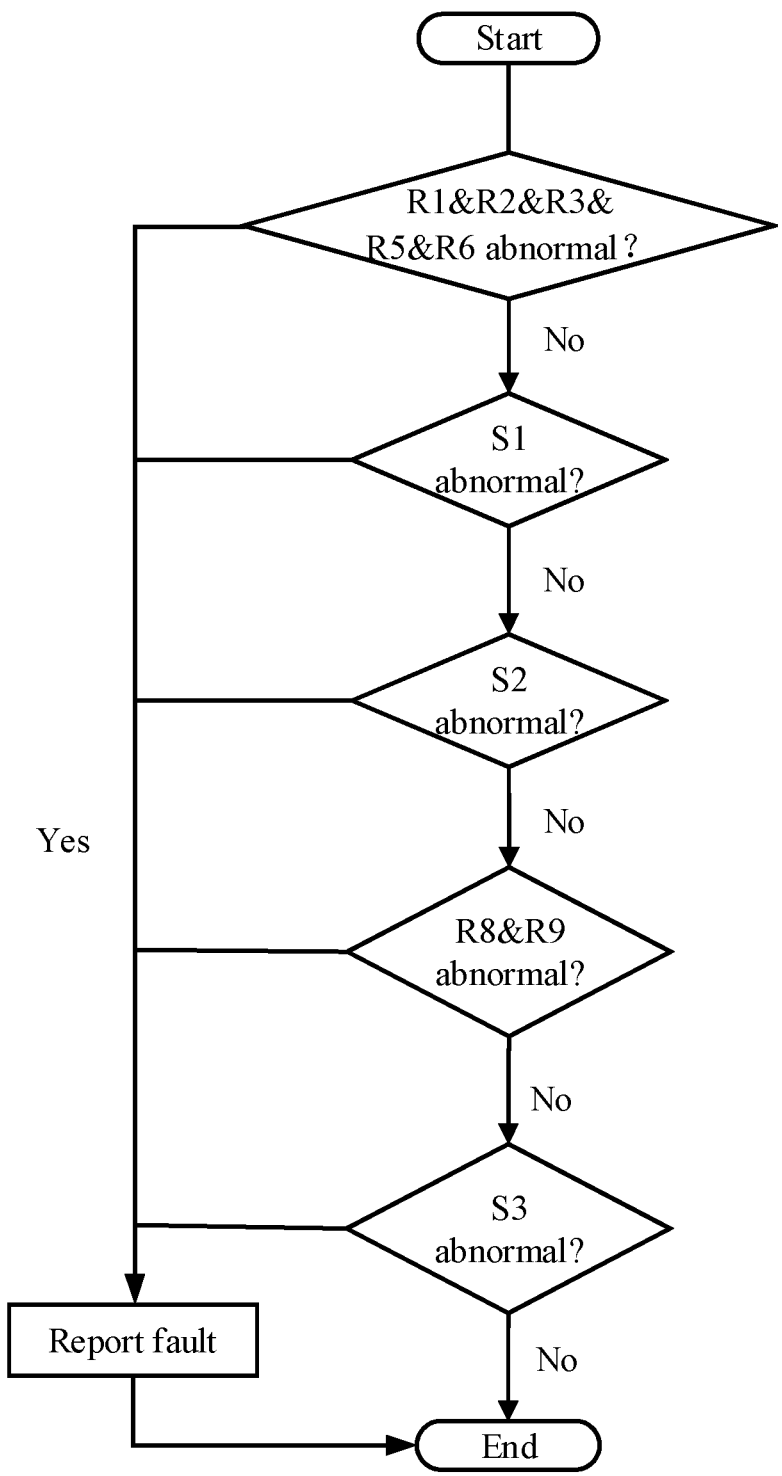
FIG. 6 is a schematic flowchart of a process of self-diagnosing of a circuit for detecting insulation resistance according to some embodiments of the present application.

Specifically, as shown in FIG. 6, first, it can be detected whether R1&R2&R3&R5&R6 work normally. If any resistor of R1&R2&R3&R5&R6 is abnormal, the corresponding fault may be reported, such as reporting the fault information of the faulty module of R1&R2&R3&R5&R6. If R1&R2&R3&R5&R6 work normally, the method proceeds to detect whether S1 is abnormal. If S1 works normally, the method proceeds to detect whether S2 is abnormal. If S2 works normally, the method proceeds to detect whether R8&R9 are abnormal. If R8&R9 work normally, the method proceeds to detect whether S3 is abnormal. If S3 works normally, the processing of self-diagnosing ends, and S520 may be performed. It can be understood that, in the processing of self-diagnosing of any component, if any abnormality is detected in the self-diagnosing process, the corresponding fault information may be reported.

At S520, insulation resistance detection is performed. That is, after the self-diagnosing of the circuit for detecting insulation resistance, if the components of the circuit for detecting insulation resistance work normally, steps S420-S440 are performed. The specific processing of steps S420-S440 may be referred to the above method embodiments, which will not be repeated here.

It should be clear that the embodiments in the specification are described in a progressive way, and the same or similar parts of each embodiment can be referred to each other. Each embodiment focuses on the differences with other embodiments. For the embodiments of the method for detecting insulation, the relevant parts can be referred to the description part of circuit for detecting insulation. The application is not limited to the specific steps and structures described above and shown in the figures. Those skilled in the art can make various changes, modifications and additions, or change the order between steps after understanding the gist of the application. And, for the sake of brevity, a detailed description of the known method and technology is omitted here.

Those skilled in the art should understand that the above-mentioned embodiments are all illustrative and not restrictive. Different technical features appearing in different embodiments can be combined to achieve beneficial effects. Those skilled in the art should be able to understand and implement other modified embodiments of the disclosed embodiments on the basis of studying the drawings, the description, and the claims. In the claims, the term "including" does not exclude other devices or steps, the indefinite article "a" does not exclude a plurality; the terms "first" and "second" are used to indicate names and not to indicate any particular order. Any reference signs in the claims should not be construed as limiting the protection scope. The functions of several parts appearing in the claims can be realized by a single hardware or software module. The presence of certain technical features in different dependent claims does not mean that these technical features cannot be combined to obtain beneficial effects.

What is claimed is:

1. A circuit for detecting insulation resistance, comprising: a first voltage dividing module, a second voltage dividing module, a third voltage dividing module, a fourth voltage dividing module, a first switch module, a fifth voltage dividing module, a second switch module, a third switch module, and a detecting module, wherein the first voltage dividing module comprises a first voltage dividing unit and a second voltage dividing unit, and the third voltage dividing module comprises a third voltage dividing unit and a fourth voltage dividing unit;

wherein a first end of the first voltage dividing unit, a first end of the second voltage dividing module, and a first end of the fourth voltage dividing module are connected to a first end of a positive electrode equivalent insulation resistor, a second end of the second voltage dividing module and a second end of the first switch module are connected to a second end of the positive electrode equivalent insulation resistor through the third switch module, and a second end of the first voltage dividing unit is connected to a first end of the second voltage dividing unit, and a first end of the first switch module is connected to a second end of the fourth voltage dividing module;

a first end of the third voltage dividing unit and a first end of the second switch module are connected to a first end of a negative electrode equivalent insulation resistor through the third switch module, a second end of the second voltage dividing unit, a second end of the fourth voltage dividing unit, and a second end of the fifth voltage dividing module are connected to a second end of the negative electrode equivalent insulation resistor, and a second end of the third voltage dividing unit is connected to a first end of the fourth voltage dividing unit, and a second end of the second switch module is connected to a first end of the fifth voltage dividing module;

the detecting module is configured to acquire voltage signals at the first end of the second voltage dividing unit and the first end of the fourth voltage dividing unit when at least one of the first switch module and the second switch module is in an OFF state; determine, on the basis of the acquired voltage signals, that the first voltage dividing module, the second voltage dividing module, the third voltage dividing module, the first switch module, and the second switch module work normally; and calculate, on the basis of the acquired voltage signals, a resistance value of the positive electrode equivalent insulation resistor and a resistance value of the negative electrode equivalent insulation resistor, wherein the circuit further comprises: a sixth voltage dividing module, a fourth switch module, a seventh voltage dividing module, and a pull-up power supply;

the sixth voltage dividing module and the fourth switch module each are arranged between a second end of the third switch module and the second end of the positive electrode equivalent insulation resistor, a first end of the sixth voltage dividing module and a first end of the fourth switch module each are connected to the second end of the third switch module, a second end of the sixth voltage dividing module and a second end of the fourth switch module each are connected to the second end of the positive electrode equivalent insulation resistor;

the seventh voltage dividing module is arranged between the second end of the third switch module and the pull-up power supply, and the pull-up power supply is arranged at a second end of the seventh voltage dividing module;

the detecting module is specifically configured to:
determine, according to a preset circuit self-checking rule, that the first voltage dividing module, the second voltage dividing module, the third voltage dividing module, the first switch module, the second switch module, the third switch module, the sixth voltage dividing module, the fourth switch module, and the seventh voltage dividing module all work normally;

acquire a first voltage signal at the first end of the second voltage dividing unit and a second voltage signal at the first end of the fourth dividing unit when the third switch module and the fourth switch module are in an ON state;

acquire a third voltage signal at the first end of the second voltage dividing unit and a fourth voltage signal at the first end of the fourth voltage dividing unit when the first switch module, the third switch module, and the fourth switch module are in an ON state, or, acquire a fifth voltage signal at the first end of the second voltage dividing unit and a sixth voltage signal at the first end of the fourth voltage dividing unit when the second switch module, the third switch module, and the fourth switch module are all in an ON state; and calculate the resistance value of the positive electrode equivalent insulation resistor and the resistance value of the negative electrode equivalent insulation resistor on the basis ofthe first voltage signal, the second voltage signal, the third voltage signal, and the fourth voltage signal, or, calculate the resistance value of the positive electrode equivalent insulation resistor and the resistance value of the negative electrode equivalent insulation resistor on the basis of the first voltage signal, the second voltage signal, the fifth voltage signal, and the sixth voltage signal.

2. A method for detecting insulation resistance, wherein the method is applied to the circuit for detecting insulation resistance according to claim 1, and the method comprises:
determining, according to a preset circuit self-checking rule, that the first voltage dividing module, the second voltage dividing module, the third voltage dividing module, the first switch module, and the second switch module all work normally;

acquiring, when the third switch module is in an ON state, a first voltage signal at the first end of the second voltage dividing unit and a second voltage signal at the first end of the fourth voltage dividing unit;

acquiring, when the first switch module or the second switch module is in an ON state and the third switch module is in an ON state, a first target voltage signal at the first end of the second voltage dividing unit and a second target voltage signal at the first end of the fourth voltage dividing unit;

calculating the resistance values of the positive electrode equivalent insulation resistor and the negative electrode equivalent insulation resistor, on the basis of the first target voltage signal, the second target voltage signal, a resistance value of the second voltage dividing module, a resistance value of the fourth voltage dividing module, a resistance value of the third voltage dividing unit, and a resistance value of the fourth voltage dividing unit.

3. The method for detecting insulation resistance according to claim 2, wherein the determining, according to a preset circuit self-checking rule, that the first voltage dividing module, the second voltage dividing module, the third voltage dividing module, the first switch module, and the second switch module all work normally comprises:

acquiring, when the first switch module, the second switch module, and the third switch module are all in an OFF state, a first self-checking voltage signal at the first end of the second voltage dividing unit and a second self-checking voltage signal at the first end of the fourth voltage dividing unit;

calculating a first voltage value across both ends of a battery module, on the basis of the first self-checking voltage signal, a resistance value of the first voltage dividing unit, and a resistance value of the second voltage dividing unit;

calculating a second voltage value across the both ends of the battery module, on the basis of the second self-checking voltage signal, the resistance value of the second voltage dividing module, the resistance value of the third voltage dividing unit, and the resistance value of the fourth voltage dividing unit;

determining, when a difference between the first voltage value and the second voltage value is less than or equal to a first preset threshold, that the first voltage dividing unit, the second voltage dividing unit, the second voltage dividing module, the third voltage dividing unit, and the fourth voltage dividing unit work normally;

acquiring a third self-checking voltage signal at the first end of the second voltage dividing unit, and a fourth self-checking voltage signal at the first end of the fourth voltage dividing unit, when the first switch module is in an ON state and the second switch module and the third switch module are both in an OFF state;

calculating a third voltage value across the both ends of the battery module, on the basis of the resistance value of the first voltage dividing unit, the resistance value of the second voltage dividing unit, and the third self-checking voltage signal;

calculating a fourth voltage value across the both ends of the battery module, on the basis of the resistance value of the second voltage dividing module, the resistance value of the third voltage dividing unit, the resistance value of the fourth voltage dividing unit, the resistance value of the fourth voltage dividing module, and the fourth self-checking voltage signal;

determining that the first switch module works normally, when a difference between the third voltage value and the fourth voltage value is less than or equal to a second preset threshold value;

acquiring a fifth self-checking voltage signal at the first end of the second voltage dividing unit and a sixth self-checking voltage signal at the first end of the fourth voltage dividing unit, when the second switch module is in an ON state and the first switch module and the third switch module are both in an OFF state;

calculating a fifth voltage value across the both ends of the battery module, on the basis of the resistance value of the first voltage dividing unit, the resistance value of the second voltage dividing unit, and the fifth self-checking voltage signal;

calculating a sixth voltage value across the both ends of the battery module, on the basis of the resistance value of the second voltage dividing module, the resistance value of the third voltage dividing unit, the resistance value of the fourth voltage dividing unit, the resistance value of the fifth voltage dividing module, and the sixth self-checking voltage signal;

determining that the second switch module works normally when a difference between the fifth voltage value and the sixth voltage value is less than or equal to the second preset threshold.

4. The method for detecting insulation resistance according to claim 3, wherein the determining that the first switch module and the second switch module work normally specifically further comprises:

acquiring, when the first switch module and the second switch module are both in an ON state and the third switch module is in an OFF state, a seventh self-checking voltage signal at the first end of the second voltage dividing unit and an eighth self-checking voltage signal at the first end of the fourth voltage dividing unit;

calculating a seventh voltage value across the both ends of the battery module, on the basis of the resistance value of the first voltage dividing unit, the resistance value of the second voltage dividing unit, and the seventh self-checking voltage signal;

calculating an eighth voltage value across the both ends of the battery module, on the basis of the resistance value of the third voltage dividing unit, the resistance value of the fourth voltage dividing unit, the resistance value of the second voltage dividing module, the resistance value of the fourth voltage dividing module, the resistance value of the fifth voltage dividing module, and the eighth self-checking voltage signal;

determining that the first switch module and the second switch module work normally when a difference between the seventh voltage value and the eighth voltage value is less than or equal to the second preset threshold value.

5. The method for detecting insulation resistance according to claim 4, wherein before acquiring, when the first switch module and the second switch module are in an OFF state and the third switch module is in an ON state, the first voltage signal at the first end of the second voltage dividing unit and the second voltage signal at the first end of the fourth voltage dividing unit, the method further comprises:

acquiring, when the first switch module, the second switch module, the third switch module, and the fourth switch module are all in an OFF state, a ninth self-checking voltage at the first end of the sixth voltage dividing module and a first reference voltage of the pull-up power supply;

calculating a ninth voltage value at the first end of the sixth voltage dividing module, on the basis of the first reference voltage, a resistance value of the sixth voltage dividing module, and a resistance value of the seventh voltage dividing module;

determining that the sixth voltage dividing module and the seventh voltage dividing module work normally when a difference between the ninth self-checking voltage and the ninth voltage value is less than or equal to a third preset threshold.

6. The method for detecting insulation resistance according to claim 5, wherein before acquiring, when the first switch module and the second switch module are in an OFF state and the third switch module is in an ON state, the first voltage signal at the first end of the second voltage dividing unit, and the second voltage signal at the first end of the fourth voltage dividing unit, the method further comprises:
acquiring, when the third switch module is in an ON state, a tenth self-checking voltage signal at the first end of the sixth voltage dividing module and a second reference voltage of the pull-up power supply;
calculating a tenth voltage value, on the basis of the resistance value of the sixth voltage dividing module, the resistance value of the seventh voltage dividing module, and the second reference voltage;
acquiring, when the tenth self-checking voltage signal is not equal to the tenth voltage value, an eleventh self-checking voltage signal at the first end of the second voltage dividing unit and a twelfth self-checking voltage signal at the first end of the fourth voltage dividing unit;
calculating a voltage of a negative electrode of a first self-checking battery module relative to ground, on the basis of the resistance value of the third voltage dividing unit, the resistance value of the fourth voltage dividing unit, and the twelfth self-checking voltage signal;
calculating a voltage of a positive electrode of the first self-checking battery relative to ground, on the basis of the voltage of the negative electrode of the first self-checking battery relative to ground, the eleventh self-checking voltage signal, the resistance value of the first voltage dividing unit, and the resistance value of the second voltage dividing unit;
calculating a first parameter, on the basis of the voltage of the positive electrode of the first self-checking battery relative to ground, the second reference voltage, the tenth self-checking voltage signal, the resistance value of the second voltage dividing module, and the resistance value of the seventh voltage dividing module;
calculating a second parameter, on the basis of the resistance value of the third voltage dividing unit, the resistance value of the fourth voltage dividing unit, the resistance value of the sixth voltage dividing module, the voltage of the negative electrode of the first self-checking battery module relative to ground, and the tenth self-checking voltage signal;
determining that the third switch module works normally when the first parameter is equal to the second parameter.

7. The method for detecting insulation resistance according to claim 6, wherein after the calculating a tenth voltage value, on the basis of the resistance value of the sixth voltage dividing module, the resistance value of the seventh voltage dividing module, and the second reference voltage, the method further comprises:
controlling the first switch module to be in an ON state when the tenth self-checking voltage signal is equal to the tenth voltage value;
acquiring, when the first switch module and the third switch module are in an ON state, a thirteenth self-checking voltage signal at the first end of the second voltage dividing unit, a fourteenth self-checking voltage signal at the first end of the fourth voltage dividing unit, a fifteenth self-checking voltage signal at the first end of the sixth voltage dividing module, and a third reference voltage of the pull-up power supply;
calculating a voltage of a negative electrode of a second self-checking battery module relative to ground, on the basis of the fourteenth self-checking voltage signal, the resistance value of the third voltage dividing unit, and the resistance value of the fourth voltage dividing unit;
calculating a voltage of a positive electrode of the second self-checking battery module relative to ground, on the basis of the resistance value of the first voltage dividing unit, the resistance value of the second voltage dividing unit, the voltage of the negative electrode of the second self-checking battery module relative to ground, and the thirteenth self-checking voltage signal;
calculating a third parameter, on the basis of the resistance value of the second voltage dividing module, the resistance value of the fourth voltage dividing module, the resistance value of the seventh voltage dividing module, the voltage of the positive electrode of the second self-checking battery module relative to ground, the third reference voltage, and the fifteenth self-checking voltage signal;
calculating a fourth parameter, on the basis of the resistance value of the third voltage dividing unit, the resistance value of the fourth voltage dividing unit, the resistance value of the sixth voltage dividing module, the voltage of the negative electrode of the second self-checking battery module relative to ground, and the fifteenth self-checking voltage signal;
determining that the third switch module works normally when the third parameter is equal to the fourth parameter.

8. The method for detecting insulation resistance according to claim 2, wherein the first target voltage signal comprises a third voltage signal or a fifth voltage signal;
wherein the third voltage signal is a voltage signal acquired at the first end of the second voltage dividing unit when the first switch module and the third switch module are in an ON state;
the fifth voltage signal is a voltage signal acquired at the first end of the second voltage dividing unit when the second switch module and the third switch module are in an ON state;
the second target voltage signal comprises a fourth voltage signal or a sixth voltage signal;
wherein the fourth voltage signal is a voltage signal acquired at the first end of the fourth voltage dividing unit when the first switch module and the third switch module are in an ON state;
the sixth voltage signal is a voltage signal acquired at the first end of the fourth voltage dividing unit when the second switch module and the third switch module are in an ON state.

9. The method for detecting insulation resistance according to claim 8, wherein the calculating the resistance value of the positive electrode equivalent insulation resistor and the resistance value of the negative electrode equivalent insulation resistor, on the basis of the first target voltage signal, the second target voltage signal, a resistance value of the second voltage dividing module, a resistance value of the fourth voltage dividing module, a resistance value of the third voltage dividing unit, and a resistance value of the fourth voltage dividing unit specifically comprises:

calculating a sum of the resistance value of the third voltage dividing unit and the resistance value of the fourth voltage dividing unit to obtain a first resistance value;

calculating a voltage of a negative electrode of a first battery module relative to ground, on the basis of the first resistance value, the resistance value of the fourth voltage dividing unit, and the second voltage signal;

calculating a voltage of a positive electrode of the first battery module relative to ground, on the basis of the resistance value of the first voltage dividing unit, the resistance value of the second voltage dividing unit, the first voltage signal, and the voltage of the negative electrode of the first battery module relative to ground;

determining a first relationship between the positive equivalent insulation resistor and the negative equivalent insulation resistor, on the basis of the voltage of the negative electrode of the first battery module relative to ground, the voltage of the positive electrode of the first battery module relative to ground, the resistance value of the second voltage dividing module, and the first resistance value;

obtaining, on the basis of the third voltage signal and the fourth voltage signal, a voltage of a negative electrode of a second battery module relative to ground and a voltage of a positive electrode of the second battery module relative to ground;

determining a second relationship between the positive electrode equivalent insulation resistor and the negative electrode equivalent insulation resistor, on the basis of the voltage of the negative electrode of the second battery module relative to ground, the voltage of the positive electrode of the second battery module relative to ground, a second resistance value, and the first resistance value, wherein the second resistance value is a parallel resistance value of the second voltage dividing module and the fourth voltage dividing module; and calculating, on the basis of the first relationship and the second relationship, the resistance value of the positive electrode equivalent insulation resistor and the resistance value of the negative electrode equivalent insulation resistor;

or, obtaining a voltage of a negative electrode of a third battery module relative to ground and a voltage of a positive electrode of the third battery module relative to ground on the basis of the fifth voltage signal and the sixth voltage signal;

determining a third relationship between the positive electrode equivalent insulation resistor and the negative electrode equivalent insulation resistor, on the basis of the voltage of the negative electrode of the third battery module relative to ground, the voltage of the positive electrode of the third battery module relative to ground, a third resistance value, and the resistance value of the second voltage dividing module, wherein the third resistance value is a parallel resistance value of the first resistance value and the fifth voltage dividing module; and calculating, on the basis of the first relationship and the third relationship, the resistance value of the positive electrode equivalent insulation resistor and the resistance value of the negative electrode equivalent insulation resistor.

* * * * *